United States Patent
Saitoh et al.

(10) Patent No.: US 12,295,158 B2
(45) Date of Patent: May 6, 2025

(54) SILICON CARBIDE SEMICONDUCTOR DEVICE

(71) Applicant: SUMITOMO ELECTRIC INDUSTRIES, LTD., Osaka (JP)

(72) Inventors: Yu Saitoh, Osaka (JP); Takeyoshi Masuda, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 442 days.

(21) Appl. No.: 17/755,235

(22) PCT Filed: Nov. 20, 2020

(86) PCT No.: PCT/JP2020/043436
§ 371 (c)(1),
(2) Date: Apr. 25, 2022

(87) PCT Pub. No.: WO2021/124800
PCT Pub. Date: Jun. 24, 2021

(65) Prior Publication Data
US 2022/0384566 A1 Dec. 1, 2022

(30) Foreign Application Priority Data

Dec. 20, 2019 (JP) .................................. 2019-230976

(51) Int. Cl.
*H10D 62/10* (2025.01)
*H01L 21/04* (2006.01)
(Continued)

(52) U.S. Cl.
CPC ......... *H10D 62/109* (2025.01); *H01L 21/046* (2013.01); *H10D 12/031* (2025.01);
(Continued)

(58) Field of Classification Search
None
See application file for complete search history.

(56) References Cited

U.S. PATENT DOCUMENTS

| 8,952,393 B2 * | 2/2015 | Wada | ................. | H10D 62/157 257/490 |
| 9,728,633 B2 * | 8/2017 | Hiyoshi | ............... | H10D 30/668 |

(Continued)

FOREIGN PATENT DOCUMENTS

| JP | 2012-169385 | 9/2012 |
| JP | 2013-214661 | 10/2013 |

(Continued)

*Primary Examiner* — Bilkis Jahan
(74) *Attorney, Agent, or Firm* — IPUSA, PLLC

(57) ABSTRACT

A silicon carbide semiconductor device includes a silicon carbide substrate having a first main surface and a second main surface opposite to the first main surface. A gate trench is provided in the first main surface. The gate trench is defined by side surfaces and a bottom surface. The side surfaces penetrate the source region and the body region to reach the drift region. The bottom surface connects to the side surfaces. The gate trench extends in a first direction parallel to the first main surface. The silicon carbide substrate further includes an electric field relaxation region that is the second conductive type, the electric field relaxation region being provided between the bottom surface and the second main surface and extending in the first direction, and a connection region that is the second conductive type, the connection region electrically connecting a contact region to the electric field relaxation region. In a plan view in a direction normal to the first main surface, the gate trench and the electric field relaxation region are disposed on a virtual line that extends in the first direction, and the connection region is in contact with the electric field relaxation region on the virtual line.

11 Claims, 35 Drawing Sheets

(51) Int. Cl.
- *H10D 12/01* (2025.01)
- *H10D 30/66* (2025.01)
- *H10D 62/17* (2025.01)
- *H10D 62/832* (2025.01)

(52) U.S. Cl.
CPC ......... *H10D 30/668* (2025.01); *H10D 62/393* (2025.01); *H10D 62/8325* (2025.01)

(56) References Cited

U.S. PATENT DOCUMENTS

| | | | |
|---|---|---|---|
| 2013/0214290 A1* | 8/2013 | Hayashi | H01L 29/66666 257/77 |
| 2013/0306986 A1* | 11/2013 | Wada | H01L 29/0661 257/77 |
| 2014/0027784 A1 | 1/2014 | Wada et al. | |
| 2015/0129895 A1* | 5/2015 | Takeuchi | H10D 30/63 257/77 |
| 2018/0331209 A1* | 11/2018 | Shiomi | H10D 62/112 |
| 2019/0074360 A1* | 3/2019 | Hiyoshi | H10D 30/60 |
| 2019/0288105 A1* | 9/2019 | Hisada | H10D 12/031 |

FOREIGN PATENT DOCUMENTS

| | | |
|---|---|---|
| JP | 2013-258369 | 12/2013 |
| JP | 2014-041990 | 3/2014 |
| WO | 2012/108165 | 8/2012 |
| WO | 2017/179377 | 10/2017 |

\* cited by examiner

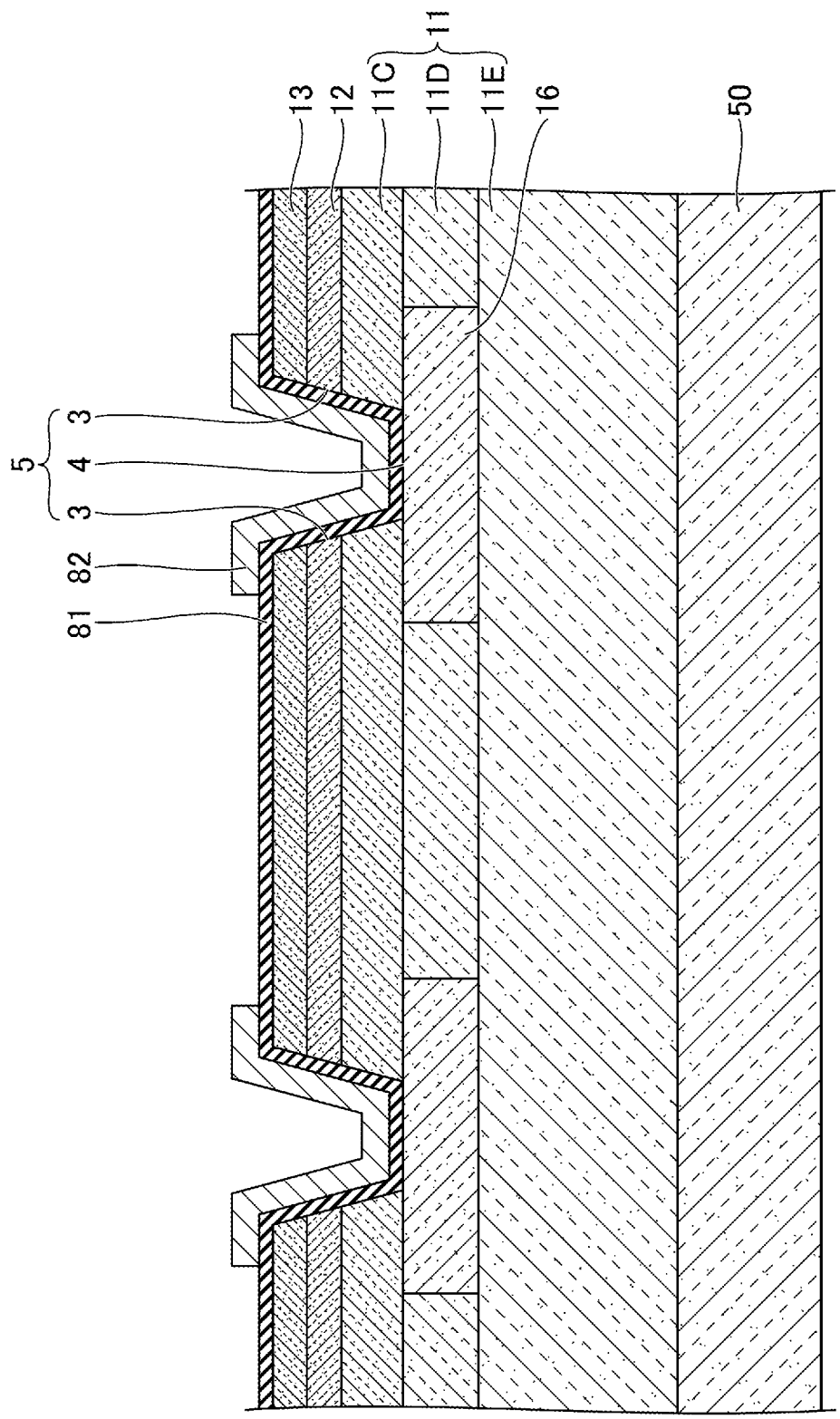

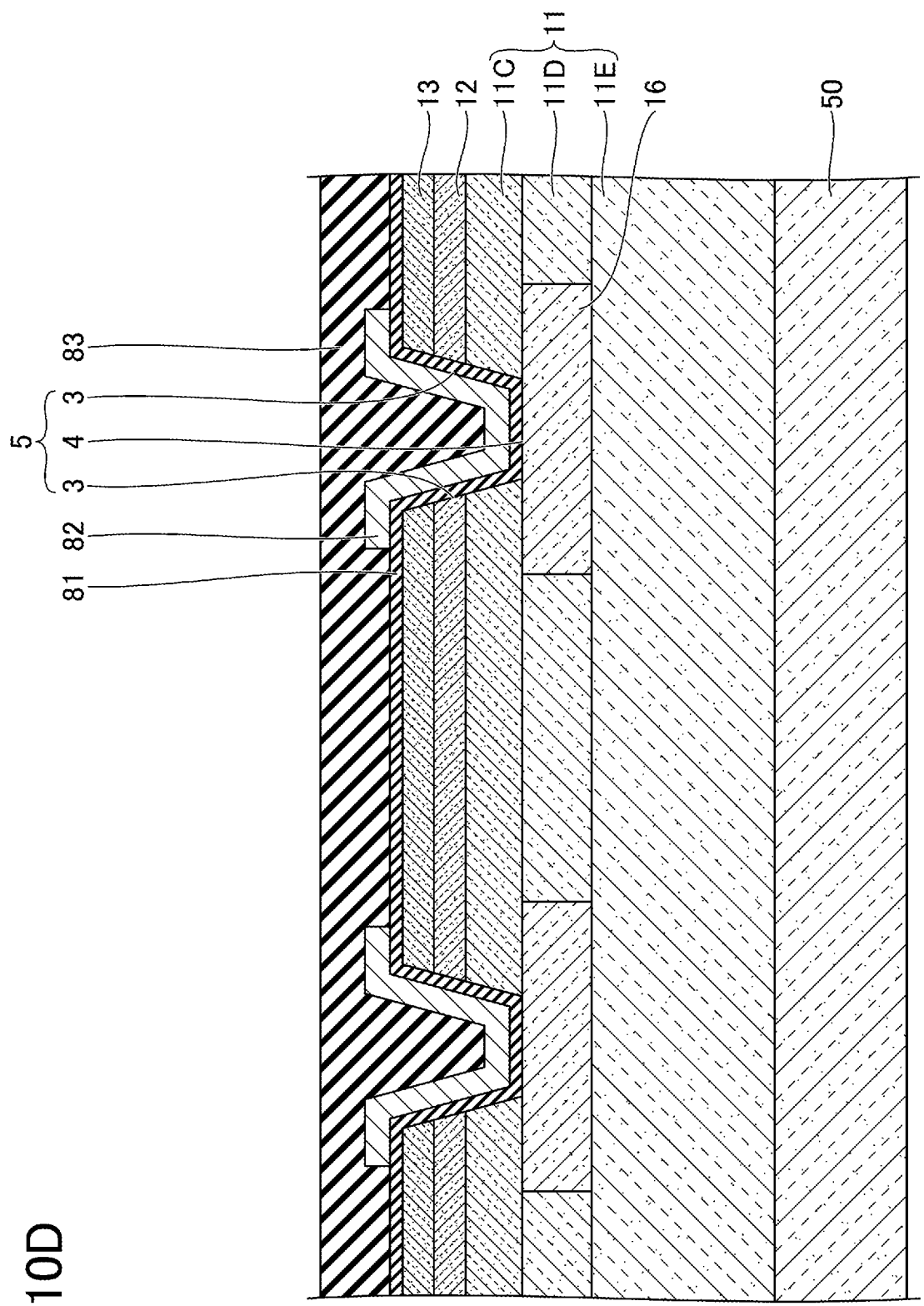

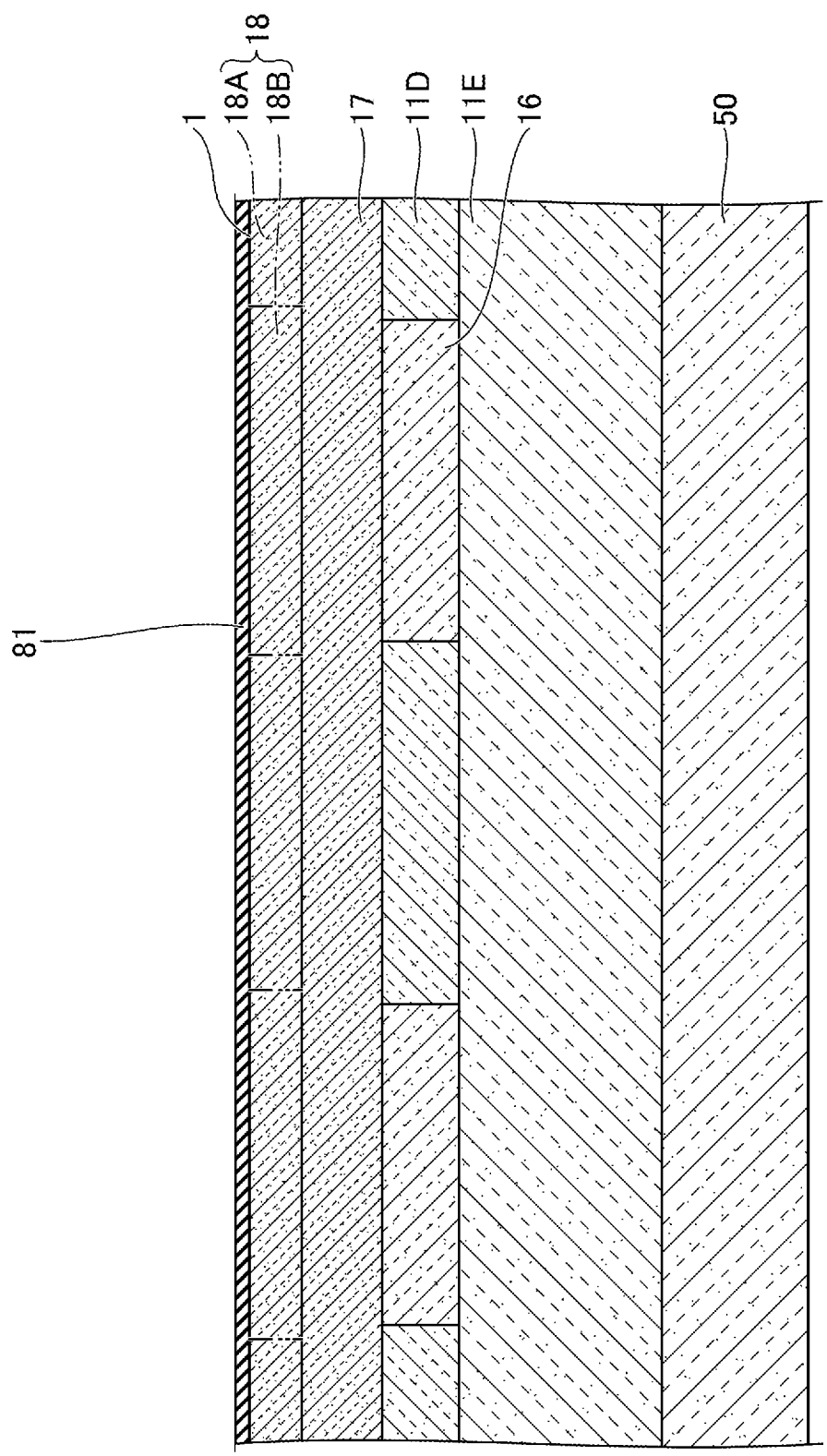

SILICON CARBIDE SEMICONDUCTOR DEVICE

TECHNICAL FIELD

The present disclosure relates to a silicon carbide semiconductor device.

This application is based upon and claims priority to Japanese Patent Application No. 2019-230976, filed Dec. 20, 2019, the entire contents of which are incorporated herein by reference.

BACKGROUND ART

As one of the silicon carbide semiconductor devices, a trench-type metal oxide semiconductor field effect transistor (MOSFET), in which an electric field shielding region is provided below a gate trench formed on a main surface, is disclosed (for example, Patent Documents 1 and 2).

RELATED ART DOCUMENTS

Patent Documents

[Patent Document 1] Japanese Unexamined Patent Application Publication No. 2014-41990
[Patent Document 2] Japanese Unexamined Patent Application Publication No. 2012-169385

SUMMARY OF THE INVENTION

A silicon carbide semiconductor device of the present disclosure includes a silicon carbide substrate having a first main surface and a second main surface opposite to the first main surface. The silicon carbide substrate includes a drift region that is a first conductive type, a body region that is a second conductive type different from the first conductive type, the body region being provided on the drift region, a source region that is the first conductive type, the source region being provided on the body region to be separated from the drift region, and a contact region that is the second conductive type, the contact region being provided on the body region. A gate trench is provided in the first main surface. The gate trench is defined by side surfaces and a bottom surface. The side surfaces penetrate the source region and the body region to reach the drift region. The bottom surface connects to the side surfaces. The gate trench extends in a first direction parallel to the first main surface. The silicon carbide semiconductor device further includes a source electrode connected to the source region and the contact region. The silicon carbide substrate further includes an electric field relaxation region that is the second conductive type, the electric field relaxation region being provided between the bottom surface and the second main surface and extending in the first direction, and a connection region that is the second conductive type, the connection region electrically connecting the contact region to the electric field relaxation region. In a plan view in a direction normal to the first main surface, the gate trench and the electric field relaxation region are disposed on a virtual line that extends in the first direction, and the connection region is in contact with the electric field relaxation region on the virtual line.

BRIEF DESCRIPTION OF THE DRAWINGS

FIG. 10C is a cross-sectional view (part 8) illustrating the method for manufacturing a silicon carbide semiconductor device according to the embodiment;

FIG. 10D is a cross-sectional view (part 9) illustrating the method for manufacturing a silicon carbide semiconductor device according to the embodiment;

FIG. 11C is a cross-sectional view (part 15) illustrating the method for manufacturing a silicon carbide semiconductor device according to the embodiment;

EMBODIMENT FOR CARRYING OUT THE INVENTION

Figure 1:
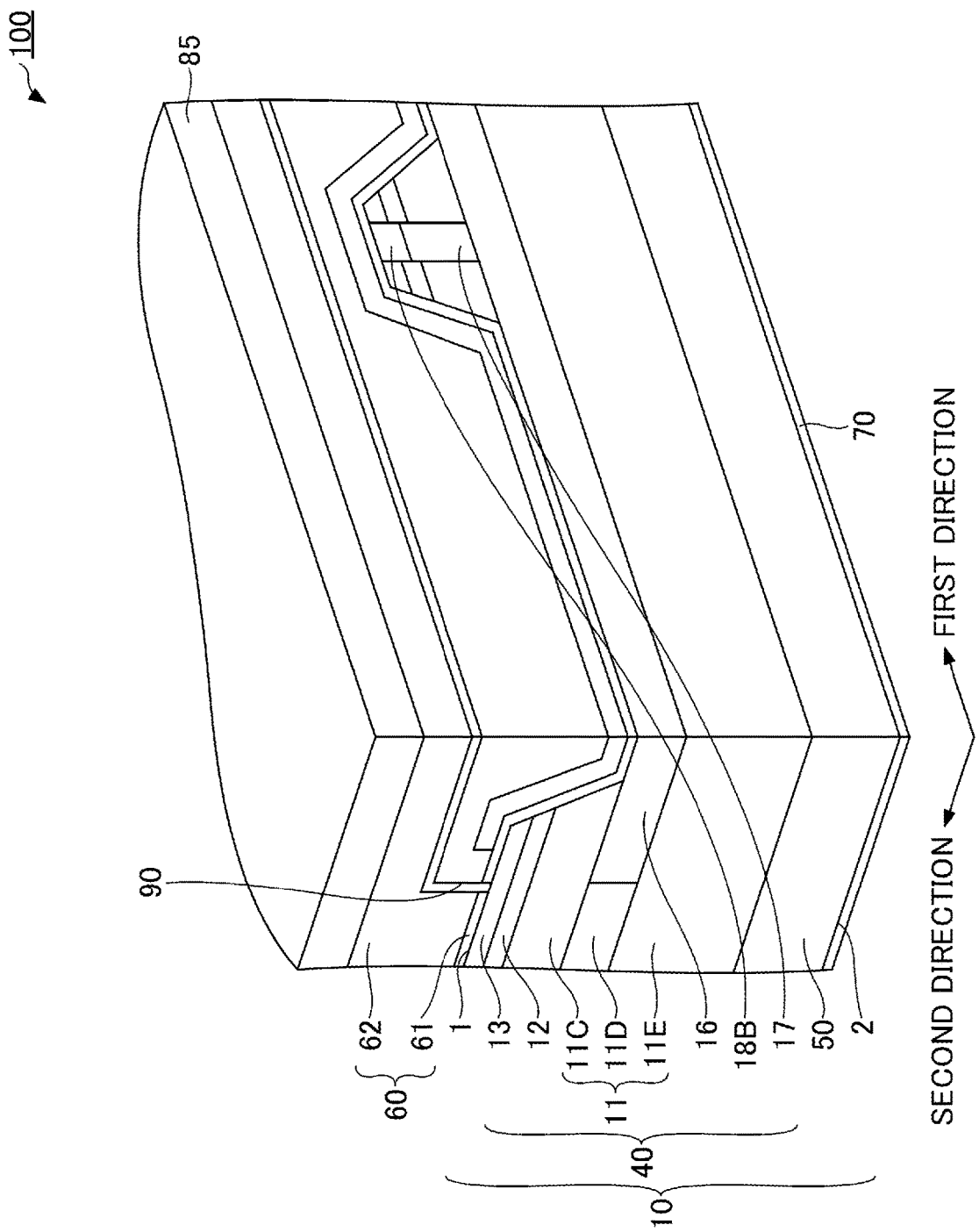
FIG. 1 is a perspective cross-sectional view (part 1) illustrating a structure of a silicon carbide semiconductor device according to an embodiment.

Problems to be Solved by the Present Disclosure

In a conventional silicon carbide semiconductor device having an electric field shielding region, a feedback capacity is large and the conduction between a source electrode and the field shielding region is blocked, and consequently switching loss is great.

Thus, the present disclosure aims to provide a silicon carbide semiconductor device that can reduce a feedback capacity and switching loss.

Effect of the Present Disclosure

According to the present disclosure, a feedback capacity and switching loss can be reduced.

Embodiments will be described below.

DESCRIPTION OF EMBODIMENTS OF THE PRESENT DISCLOSURE

First, an embodiment of the present disclosure will be described. In the following description, the same or corresponding elements are referenced by the same reference numerals and the description thereof is not repeated. In the crystallographic description in the present specification, the individual orientation is indicated by [ ], the collective orientations are indicated by < >, the individual plane is indicated by ( ), and the collective planes are indicated by { }. A negative crystallographic index is usually expressed by placing "-" (a bar) above the number, but in the present specification, a negative sign is placed in front of the number.

[1] A silicon carbide semiconductor device according to an embodiment of the present disclosure includes a silicon carbide substrate having a first main surface and a second main surface opposite to the first main surface. The silicon carbide substrate includes a drift region that is a first conductive type, a body region that is a second conductive type different from the first conductive type, the body region being provided on the drift region, a source region that is the first conductive type, the source region being provided on the body region to be separated from the drift region, and a contact region that is the second conductive type, the contact region being provided on the body region. A gate trench is provided in the first main surface. The gate trench is defined by side surfaces and a bottom surface. The side surfaces penetrate the source region and the body region to reach the drift region. The bottom surface connects to the side surfaces. The gate trench extends in a first direction parallel to the first main surface. The silicon carbide semiconductor device further includes a source electrode connected to the source region and the contact region. The silicon carbide substrate further includes an electric field relaxation region that is the second conductive type, the electric field relaxation region being provided between the bottom surface and the second main surface and extending in the first direction, and a connection region that is the second conductive type, the connection region electrically connecting the contact region to the electric field relaxation region. In a plan view in a direction normal to the first main surface, the gate trench and the electric field relaxation region are disposed on a virtual line that extends in the first direction, and the connection region is in contact with the electric field relaxation region on the virtual line.

The contact region and the electric field relaxation region are electrically connected by the connection region. The contact region is electrically connected to the source electrode. Thus, the electric field relaxation region is electrically connected to the source electrode. Therefore, the feedback capacity can be reduced and the carrier can be efficiently supplied from the source electrode to the electric field relaxation region, and switching loss can be reduced by accelerating an action of the depletion layer extending from the electric field relaxation region to the drift region during the switching operation. Additionally, the gate trench and the electric field relaxation region are disposed on the virtual line, and the connection region is in contact with the electric field relaxation region on the virtual line. Thus, the connection region is unlikely to inhibit current flowing along a portion of the side surface of the gate trench that is parallel to the first direction. Therefore, sufficient current can be obtained when turned on.

[2] In [1], the plurality of gate trenches are provided to overlap the virtual line at regular intervals, and the connection region may be provided between adjacent gate trenches in the first direction in the plan view in the direction normal to the first main surface. The connection region is provided between the adjacent gate trenches in the first direction in the plan view in the direction normal to the first main surface, so that a large connection region can be easily obtained and the electrical resistance in the connection region can be easily reduced.

[3] In [2], a gate insulating film that is contact with the side surfaces and the bottom surface, a gate electrode provided on the gate insulating film to sandwich the gate insulating film between the gate electrode and the silicon carbide substrate, and an interlayer insulating film provided to cover the gate electrode are further included. In the plan view in the direction normal to the first main surface, the contact region has a first region and a second region. The first region is provided to be spaced away from the interlayer insulating film in a second direction perpendicular to the first direction. The second region is provided between the adjacent gate trenches in the first direction. The source electrode is connected to the first region, and the first dimension of the first region in the first direction may be larger than the second dimension of the second region in the first direction. The first dimension is larger than the second dimension, so that a range where a current flows when turned on can be widely obtained while reducing the contact resistance between the first region and the source electrode.

[4] In [3], the first dimension may be one or greater and six or less times the second dimension. The first dimension is one or greater and six or less times the second dimension, so that a range where a current flows when turned on can be widely obtained while reducing the contact resistance between the first region and the source electrode, and further, the contact resistance between the source region and the source electrode can be kept low.

[5] In [3] or [4], the source region and the first region are alternately provided in the first direction, and the first dimension may be larger than the third dimension of the source region in the first direction. The first dimension is larger than the third dimension, so that each of the contact resistance between the first region and the source electrode and the contact resistance between the source region and the source electrode can be kept low.

[6] In [3] or [4], the source region and the first region are alternately provided in the first direction, and the first dimension may be 0.2 or greater and 0.6 or less times the sum of the first dimension and the third dimension of the source region in the first direction. The first dimension is 0.2 or greater and 0.6 or less times the sum of the first and third dimensions, so that each of the contact resistance between the first region and the source electrode and the contact resistance between the source region and the source electrode can be kept low.

[7] In [3] to [6], the second region may be exposed from the interlayer insulating film, and the source electrode may be also connected to the second region. The source electrode is also connected to the second region, so that the contact resistance between the contact region and the source electrode can be further reduced.

[8] In [3] to [7], the first region of the contact region may be provided on each side of the gate trench in the second direction. The first region of the contact region is provided on each side of the gate trench in the second direction, so that the electric resistance between the source electrode and the electric field relaxation region is easily suppressed.

[9] In [3] to [7], the first region of the contact region may be provided on only one side of the gate trench in the second direction. The first region of the contact region is provided on only one side of the gate trench in the second direction, so that a contact hole on the side where the first region is not provided may be narrower than a contact hole on the side where the first region is provided, and thus the cell pitch in the second direction is easily narrowed.

[10] In [1] to [9], the first effective concentration of the second conductivity type impurity in the contact region may be higher than the second effective concentration of the second conductivity type impurity in the connection region. The first effective concentration is higher than the second effective concentration, so that leakage current is easily suppressed while suppressing contact resistance between the contact region and the source electrode.

[11] In [1] to [10], the side surfaces of the gate trench may include a {0-33-8} plane. The side surfaces include a {0-33-8} plane, so that good mobility can be obtained at the side surfaces of the gate trench, thereby reducing the channel resistance.

EMBODIMENT OF THE PRESENT DISCLOSURE

Figure 2:
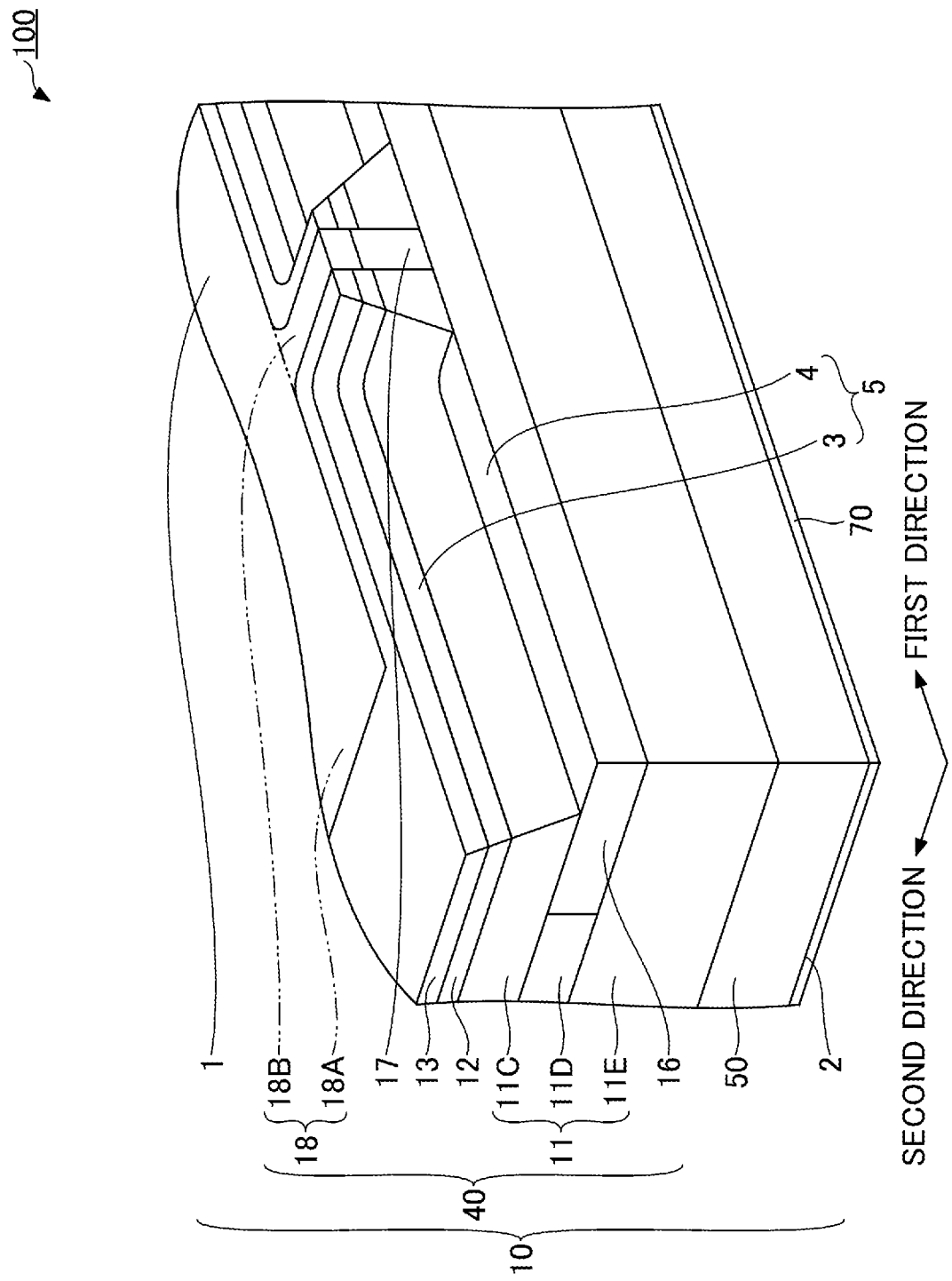
FIG. 2 is a perspective cross-sectional view (part 2) of the configuration of the silicon carbide semiconductor device according to the embodiment.
Figure 3:
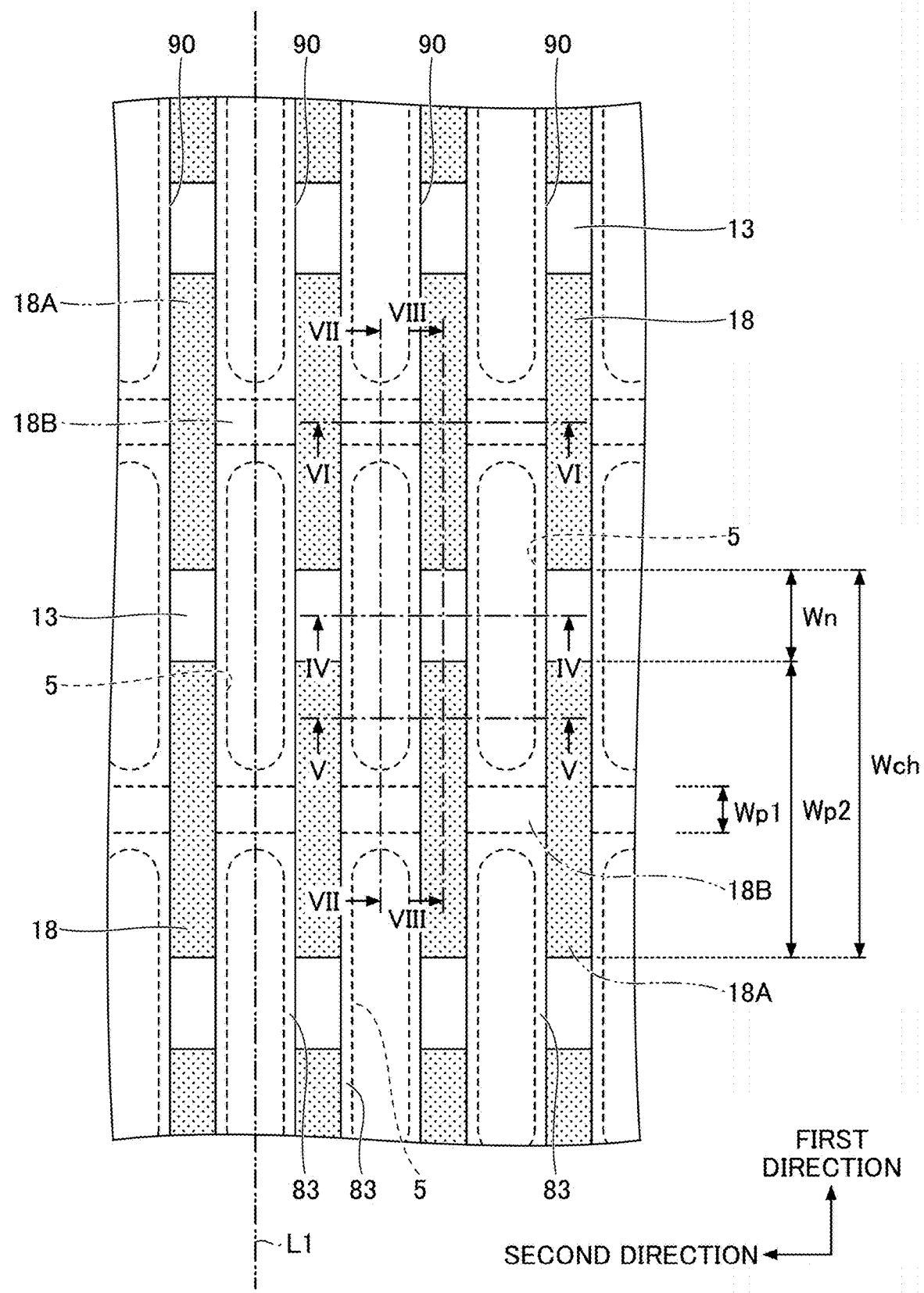
FIG. 3 is a diagram illustrating a structure of an interlayer insulating film and a first main surface of the silicon carbide semiconductor device according to the embodiment.
Figure 4:
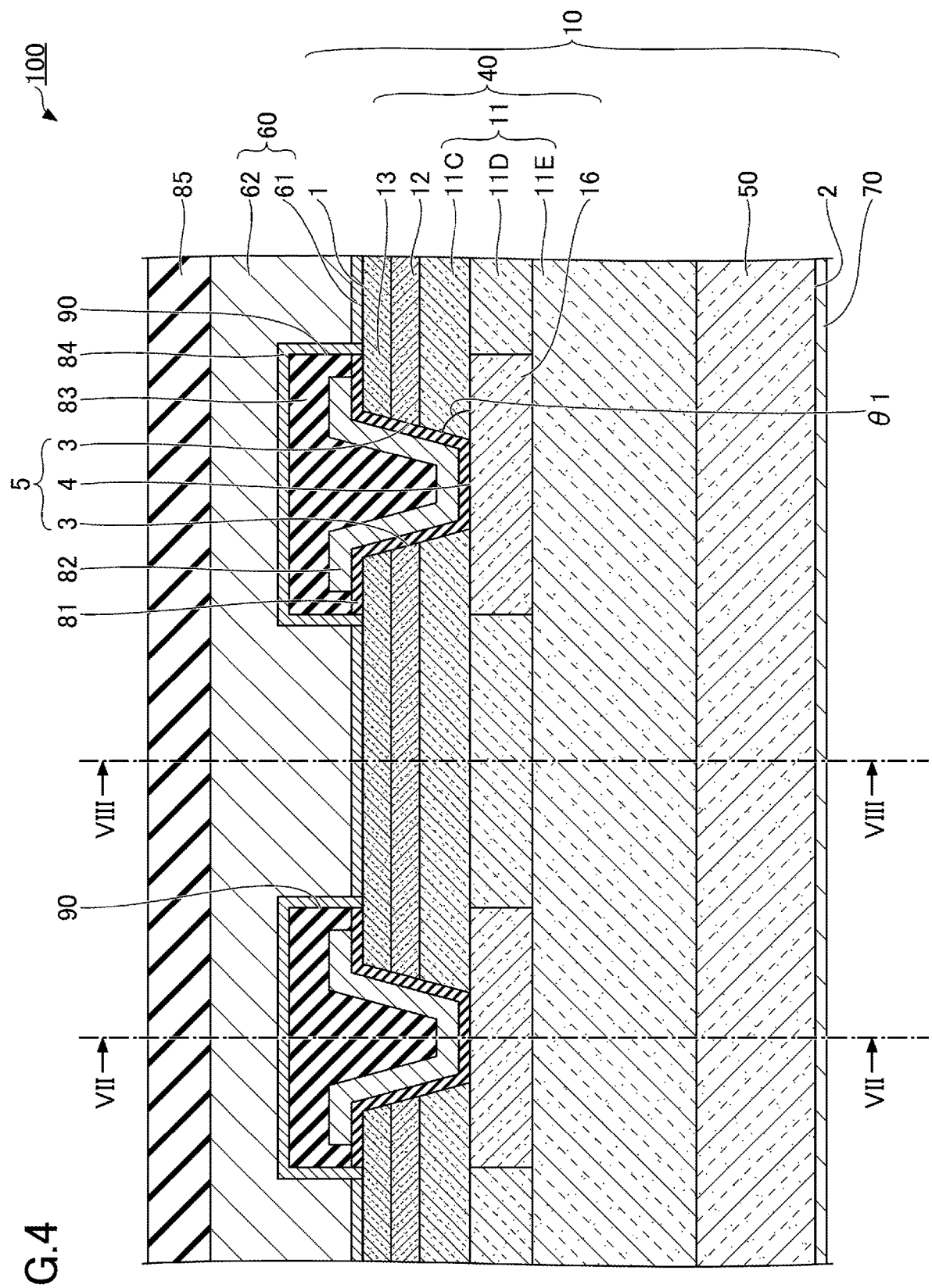
FIG. 4 is a cross-sectional view (part 1) illustrating the structure of a silicon carbide semiconductor device according to the embodiment.
Figure 5:
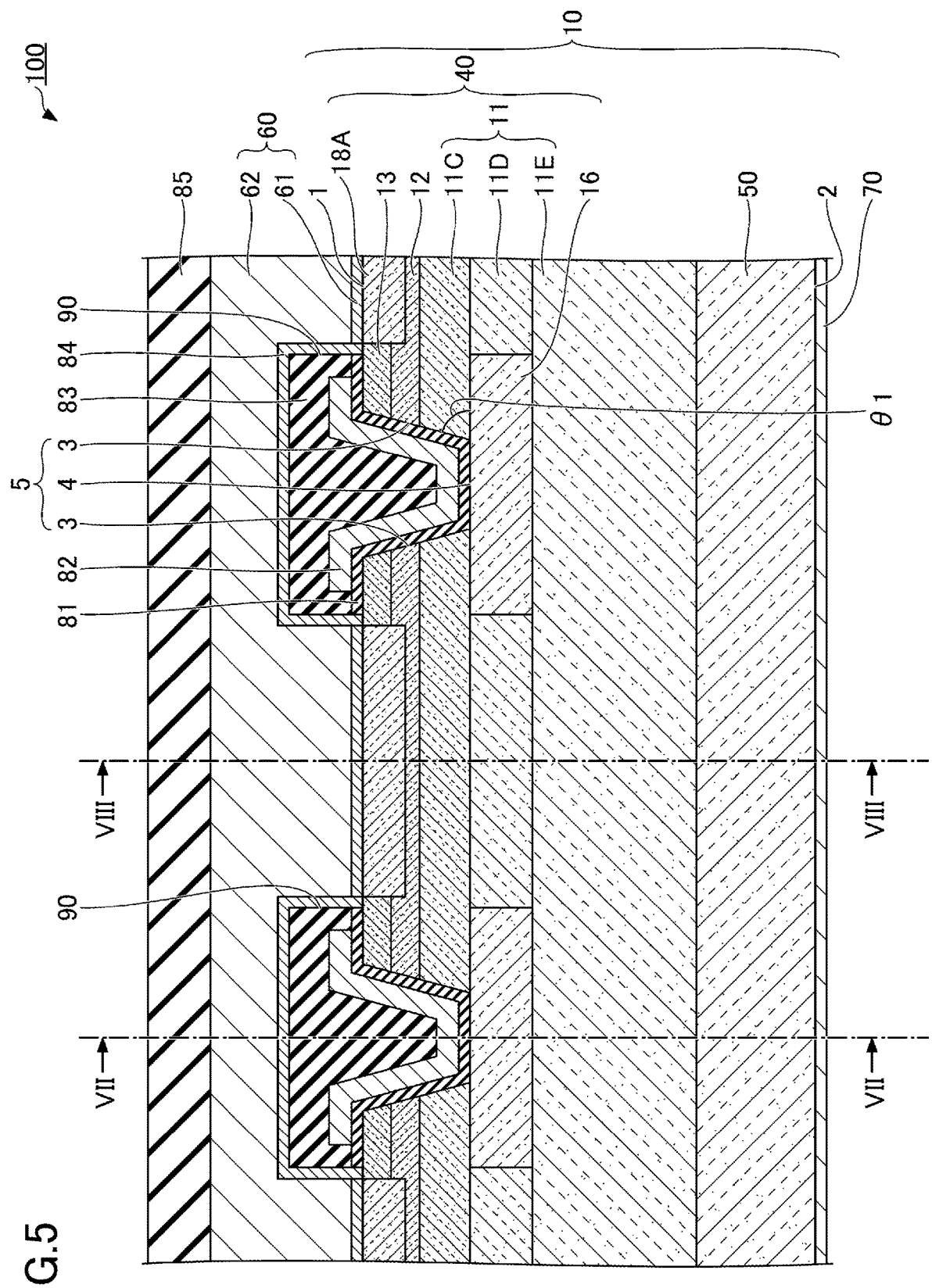
FIG. 5 is a cross-sectional view (part 2) illustrating the structure of the silicon carbide semiconductor device according to the embodiment.
Figure 6:
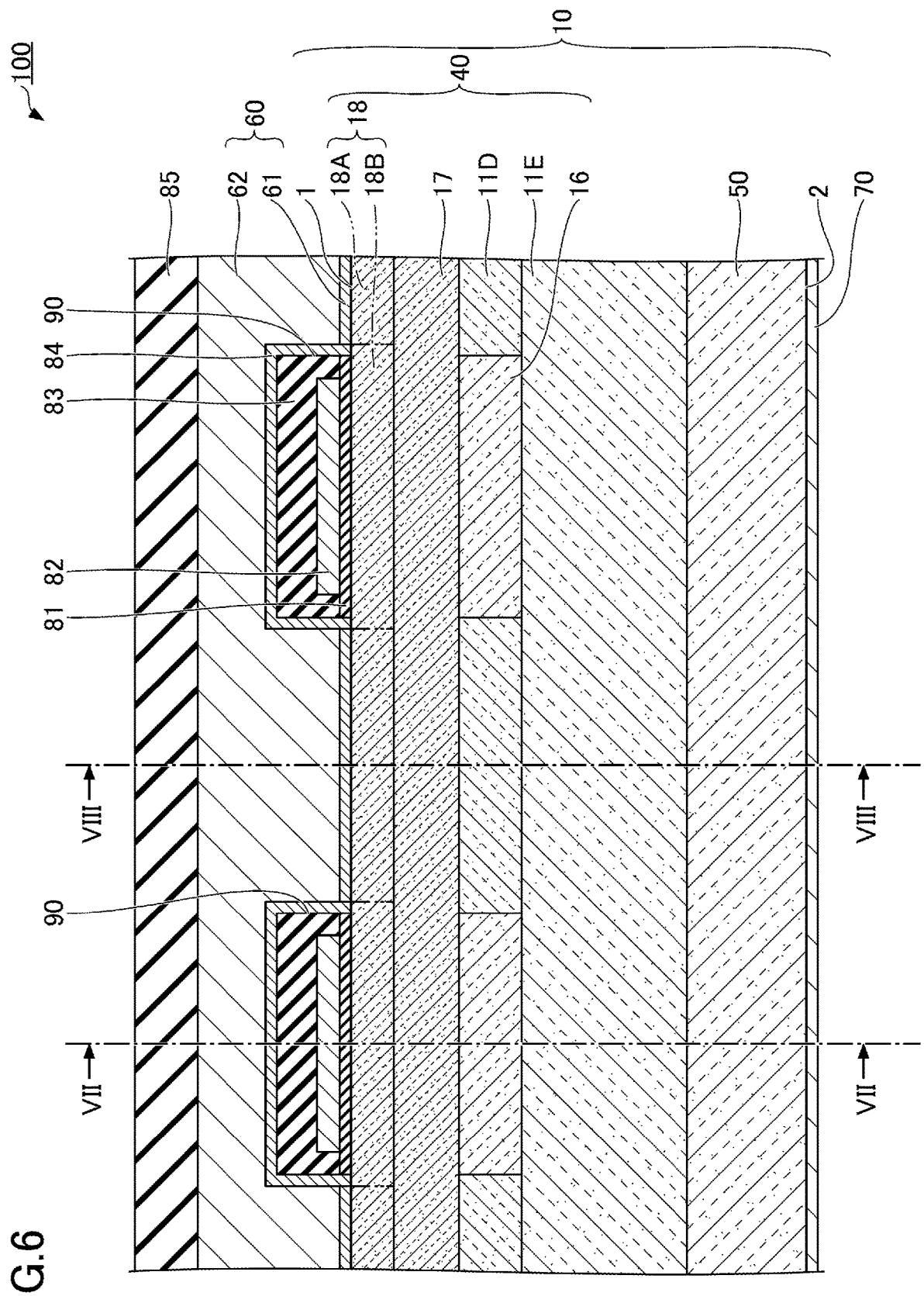
FIG. 6 is a cross-sectional view (part 3) illustrating the structure of the silicon carbide semiconductor device according to the embodiment.
Figure 7:
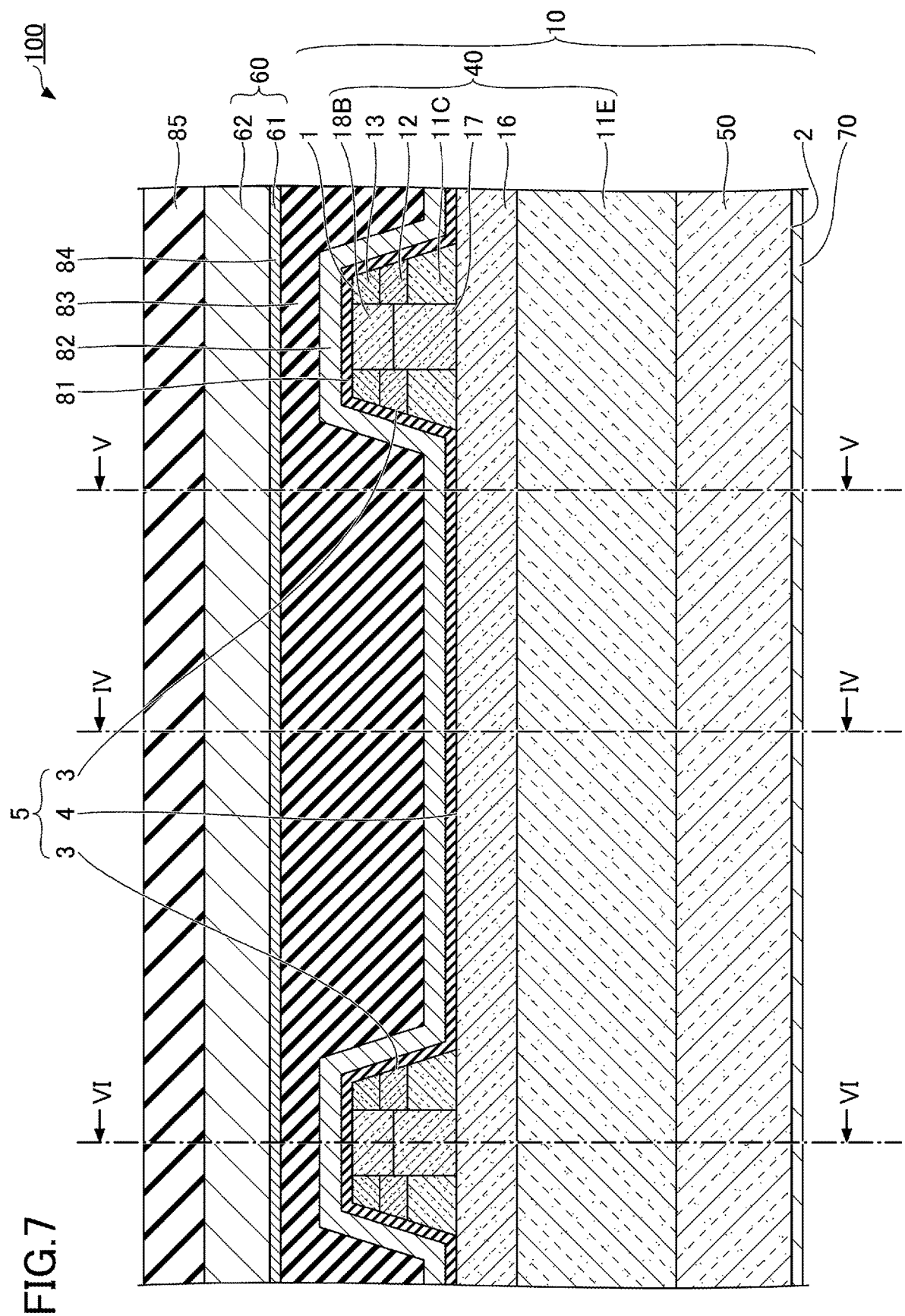
FIG. 7 is a cross-sectional view (part 4) illustrating the structure of the silicon carbide semiconductor device according to the embodiment.
Figure 8:
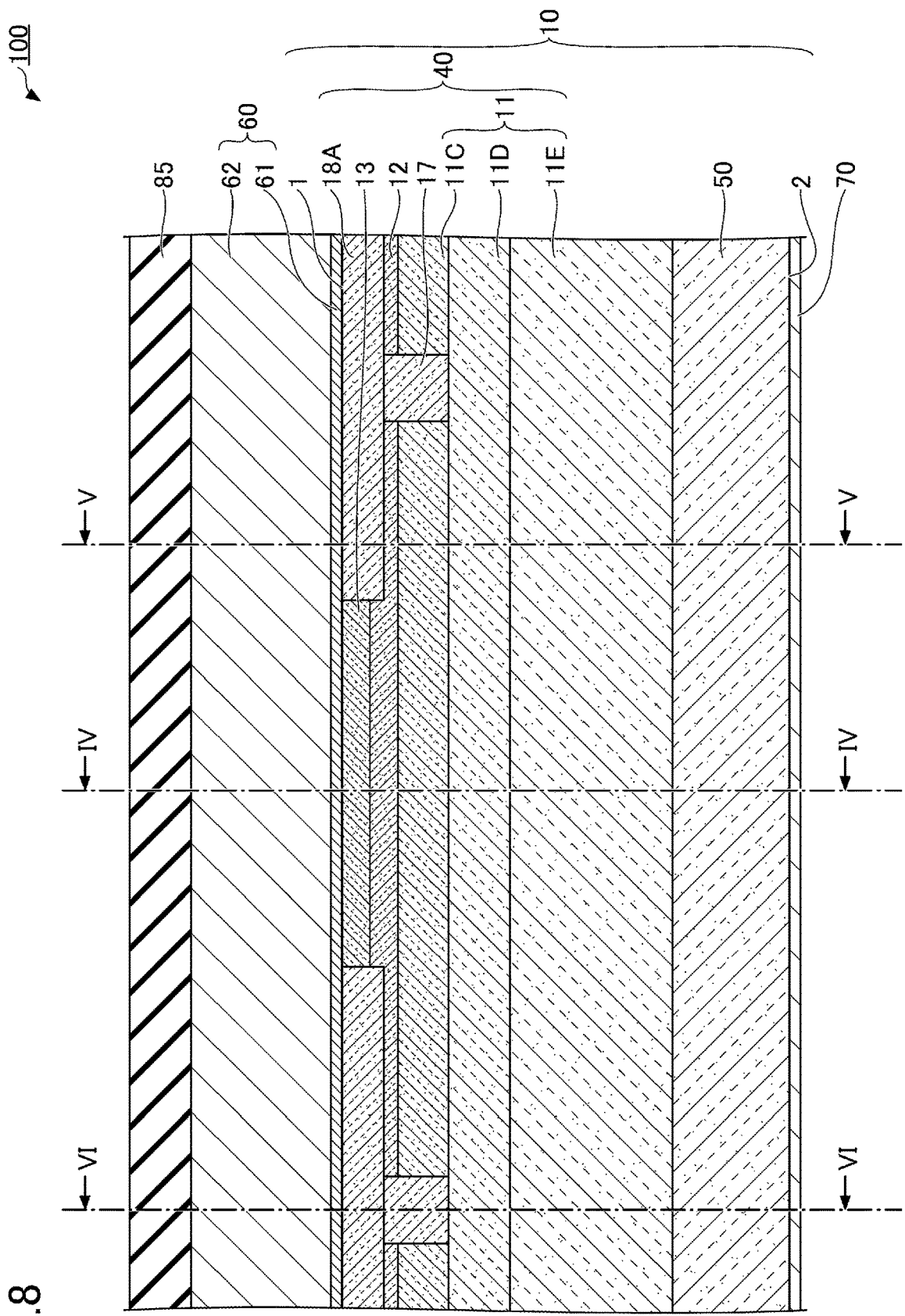
FIG. 8 is a cross-sectional view (part 5) illustrating the structure of the silicon carbide semiconductor device according to the embodiment.

The embodiment of the present disclosure relates to what is called a vertical MOSFET. FIG. 1 and FIG. 2 are perspective cross-sectional views illustrating a structure of a silicon carbide semiconductor device according to the embodiment. FIG. 2 illustrates a portion of an internal structure of the silicon carbide semiconductor device in a perspective view. FIG. 3 is a diagram illustrating a structure of an interlayer insulating film and a first main surface of the silicon carbide semiconductor device according to the embodiment. FIGS. 4 to 8 are cross-sectional views illustrating the structure of the silicon carbide semiconductor device according to the embodiment. FIG. 4 corresponds to a cross-sectional view along the IV-IV lines in FIGS. 3, 7, and 8. FIG. 5 corresponds to a cross-sectional view along the V-V lines in FIGS. 3, 7, and 8. FIG. 6 corresponds to a cross-sectional view along the VI-VI lines in FIGS. 3, 7, and 8. FIG. 7 corresponds to a cross-sectional view along the VII-VII lines in FIGS. 3, 4, 5, and 6. FIG. 8 corresponds to a cross-sectional view along the VIII-VIII lines in FIGS. 3, 4, 5, and 6.

As illustrated in FIGS. 1 to 8, a MOSFET 100 according to the present embodiment primarily includes a silicon carbide substrate 10, a gate insulating film 81, a gate electrode 82, an interlayer insulating film 83, a source electrode 60, a drain electrode 70, a barrier metal film 84, and a passivation film 85. The silicon carbide substrate 10 includes a silicon carbide single crystal substrate 50 and a silicon carbide epitaxial layer 40 on the silicon carbide single crystal substrate 50. The silicon carbide substrate 10 has a first main surface 1 and a second main surface 2 opposite to the first main surface 1. The silicon carbide epitaxial layer 40 forms the first main surface 1, and the silicon carbide single crystal substrate 50 forms the second main surface 2. The silicon carbide single crystal substrate 50 and silicon carbide epitaxial layer 40 are formed of, for example, hexagonal silicon carbide of polytype 4H. The silicon carbide single crystal substrate 50 contains an n-type impurity such as nitrogen (N), and is an n-type (a first conductivity type). The maximum dimension of the first main surface 1 of the silicon carbide substrate 10 is, for example, 100 mm or greater, and preferably 150 mm or greater.

The first main surface 1 is the {0001} plane or a plane in which the {0001} plane is inclined in an off direction by an off angle of 8° or less. Preferably, the first main surface 1 is the (000-1) plane or a surface in which the plane (000-1) inclined in the off direction by an off angle of 8° or less. The off direction may be, for example, the <11-20> direction or <1-100> direction. The off angle may be, for example, 1° or greater, or 2° or greater. The off angle may be 6° or less or 4° or less.

The silicon carbide epitaxial layer 40 primarily has a drift region 11, a body region 12, a source region 13, an electric field relaxation region 16, a connection region 17, and a contact region 18.

The drift region 11 contains an n-type impurity, such as nitrogen or phosphorus (P), and is an n-type conductivity type. The drift region 11 primarily has, for example, a third region 11C, a fourth region 11D, and a fifth region 11E.

The body region 12 is provided on the drift region 11. The body region 12 contains a p-type impurity, such as aluminum (Al), and is a p-type conductivity type (a second conductivity type). The effective concentration of the p-type impurity in the body region 12 is greater than or equal to $5 \times 10^{17}$ cm$^{-3}$. The short channel effect (the punchthrough) can be caused by a depletion region spreading from a pn junction region to a channel region and the depletion region spreading in the entire channel region. By increasing the effective concentration of the p-type impurity in the body region 12, the spread of the depletion layer formed in the channel region can be reduced. The thickness of the body region 12 may be, for example, less than 0.7 μm. The effective concentration of the p-type impurity in the body region 12 is, for example, about $1 \times 10^{18}$ cm$^{-3}$.

The source region 13 is provided on the body region 12 to be separated from the drift region 11 by the body region 12. The source region 13 contains an n-type impurity, such as nitrogen or phosphorus, and is an n-type conductivity type. The source region 13 forms the first main surface 1. The effective concentration of the n-type impurity in the source region 13 may be higher than the effective concentration of the p-type impurity in the body region 12. The effective concentration of the n-type impurity in the source region 13 is, for example, about $1 \times 10^{19}$ cm$^{-3}$.

The contact region 18 contains a p-type impurity such as aluminum and is a p-type conductivity type. The contact region 18 forms the first main surface 1. The contact region 18 primarily has, for example, a first region 18A and a second region 18B. The effective concentration of the p-type impurity in the contact region 18 is higher than the effective concentration of the p-type impurity in body region 12 and the effective concentration of the p-type impurity in the connection region 17, for example. The contact region 18 penetrates the source region 13 and comes in contact with the body region 12. The effective concentration of the p-type impurity in the contact region 18 is, for example, $1 \times 10^{18}$ cm$^{-3}$ or greater and $1 \times 10^{20}$ cm$^{-3}$ or less.

In the first main surface 1, a gate trench 5 defined by side surfaces 3 and a bottom surface 4 is provided. The side surfaces 3 penetrate the source region 13, the body region 12, and the drift region 11 to reach the electric field relaxation region 16. The bottom surface 4 connects to the side surfaces 3. The bottom surface 4 is located on the electric field relaxation region 16. The bottom surface 4 is, for example, a plane parallel to the second main surface 2. An angle θ1 of the side surface 3 relative to a plane including the bottom surface 4 is, for example, 45° or greater and 65° or less. The angle θ1 may be, for example, 50° or greater. The angle θ1 may be, for example, 60° or less. The side surfaces 3 preferably have the plane {0-33-8}. The {0-33-8} plane is a crystalline plane with excellent mobility.

In particular, as illustrated in FIG. 3, in a plan view in a direction normal to the first main surface 1, the gate trench 5 overlaps a virtual line L1 extending in a first direction parallel to the first main surface 1. In the plan view in the direction normal to the first main surface 1, the gate trench 5 is disposed on the virtual line L1. Multiple gate trenches 5 are provided on the virtual line L1 at constant intervals. Additionally, in the plan view in the direction normal to the first main surface 1, multiple gate trenches 5 are provided in a second direction perpendicular to the first direction at constant intervals. Multiple gate trenches 5 may be provided, for example, in an array.

The electric field relaxation region 16 contains a p-type impurity such as Al, and is a p-type conductivity type. The electric field relaxation region 16 is located between the bottom surface 4 of the gate trench 5 and the second main surface 2. An upper end surface of the electric field relaxation region 16 includes, for example, the bottom surface 4 of the gate trench 5. A portion of the upper end surface of the electric field relaxation region 16 is opposed to a portion of a lower end surface of the body region 12. The electric field relaxation region 16, as with the gate trench 5, overlaps the virtual line L1 in the plan view in the direction normal to the first main surface 1. In the plan view in the direction normal to the first main surface 1, the electric field relaxation region 16 is located on the virtual line L1. On the virtual line L1, the electric field relaxation region 16 may be commonly provided for multiple gate trenches 5. Additionally, in the plan view in the direction normal to the first main surface 1, multiple electric field relaxation regions 16 are provided in the second direction perpendicular to the first direction at constant intervals. Multiple electric field relaxation regions 16 may be provided in stripes. The effective concentration of the p-type impurity in the electric field relaxation region 16 is, for example, $5 \times 10^{17}$ cm$^{-3}$ or greater and $5 \times 10^{18}$ cm$^{-3}$ or less.

The third region 11C of the drift region 11 is sandwiched between the body region 12 and the electric field relaxation region 16. The third region 11C is in contact with each of the body region 12 and the electric field relaxation region 16. The third region 11C is located closer to the second main surface 2 than the body region 12 is. The third region 11C is located closer to the first main surface 1 than the electric field relaxation region 16 is. The effective concentration of the n-type impurity in the third region 11C is, for example, $5 \times 10^{15}$ cm$^{-3}$ or greater and $5 \times 10^{16}$ cm$^{-3}$ or less.

The fourth region 11D is located closer to the second main surface 2 than the third region 11C is. The fourth region 11D is connected to the third region 11C. The fourth region 11D comes in contact with the electric field relaxation region 16 in a direction parallel to the second main surface 2. The fourth region 11D and the electric field relaxation region 16 may be located in a plane parallel to the second main surface 2. The effective concentration of the n-type impurity in the fourth region 11D may be higher than the effective concentration of the n-type impurity in the third region 11C. The effective concentration of the n-type impurity in the fourth region 11D is, for example, $5 \times 10^{16}$ cm$^{-3}$ or greater and $5 \times 10^{17}$ cm$^{-3}$ or less.

The fifth region 11E is located closer to the second main surface 2 than the fourth region 11D is. The fifth region 11E is connected to the fourth region 11D. The fifth region 11E is in contact with the electric field relaxation region 16. The fifth region 11E is located closer to the second main surface 2 than the electric field relaxation region 16 is. The fifth region 11E may be sandwiched between the fourth region 11D and the silicon carbide single crystal substrate 50. Th fifth region 11E may be connected to the silicon carbide single crystal substrate 50. The effective concentration of the n-type impurity in the fifth region 11E may be less than the effective concentration of the n-type impurity in the fourth region 11D. The effective concentration of the n-type impurity in the fifth region 11E is, for example, $5 \times 10^{15}$ cm$^{-3}$ or greater and $5 \times 10^{16}$ cm$^{-3}$ or less.

The gate insulating film 81 is, for example, an oxide film. The gate insulating film 81 is formed of a material containing, for example, silicon dioxide. The gate insulating film 81 is in contact with the side surfaces 3 and the bottom surface 4. The gate insulating film 81 is in contact with the electric field relaxation region 16 at the bottom surface 4. The gate insulating film 81 is in contact with each of the source region 13, the body region 12, and the drift region 11 at the side surface 3. The gate insulating film 81 may be in contact with the source region 13 at the first main surface 1.

The gate electrode 82 is provided on the gate insulating film 81. The gate electrode 82 is formed of polysilicon (poly-Si) containing a conductive impurity, for example. The gate electrode 82 is disposed inside the gate trench 5. A portion of the gate electrode 82 may be disposed on the first main surface 1.

The interlayer insulating film 83 is provided in contact with the gate electrode 82 and the gate insulating film 81. The interlayer insulating film 83 is formed of a material containing silicon dioxide, for example. The interlayer insulating film 83 electrically isolates the gate electrode 82 from the source electrode 60. A portion of the interlayer insulating film 83 may be provided inside the gate trench 5.

The interlayer insulating film 83, as with the gate trench 5 and the electric field relaxation region 16, overlaps the virtual line L1 in the plan view in the direction normal to the first main surface 1. On the virtual line L1, the interlayer insulating film 83 may be commonly provided for multiple gate trenches 5. In the plan view in the direction normal to the first main surface 1, in the interlayer insulating film 83 and the gate insulating film 81, contact holes 90 are formed in the second direction at constant intervals. The contact hole 90 is provided such that the gate trench 5 is disposed between the contact holes 90 adjacent in the second direction in the plan view in the direction normal to the first main surface 1. The contact hole 90 extends in the first direction. Through the contact hole 90, the source region 13 and the contact region 18 are exposed from the interlayer insulating film 83 and the gate insulating film 81. The dimension of the contact hole 90 in the second direction may be, for example, 1 μm or less.

In particular, as illustrated in FIG. 3, the first region 18A of the contact region 18 is exposed from the interlayer insulating film 83 through the contact hole 90. The first region 18A may be provided between the gate trenches 5 adjacent in the second direction. The first region 18A and the source region 13 may be alternately provided in the first direction between two gate trenches 5 adjacent in the second direction. For example, the first region 18A may be provided near the end of the gate trench 5 in the first direction and the source region 13 may be provided near the center of the gate trench 5 in the first direction. The first region 18A is provided on each side of the gate trench 5 in the second direction. The first region 18A and the source region 13 may be exposed from all contact holes 90.

The second region 18B is provided between the gate trenches 5 adjacent in the first direction. The second region 18B is covered by an interlayer insulating film 83 and the barrier metal film 84. The second region 18B is connected to the first region 18A in the second direction. The first region 18A and the second region 18B are alternately provided in the second direction. For example, the first dimension Wp1 of the first region 18A in the first direction is greater than the second dimension Wp2 of the second region 18B in the first direction.

The connection region 17 contains a p-type impurity, such as Al, and is a p-type conductivity type. The connection region 17 electrically connects the contact region 18 to the electric field relaxation region 16. The connection region 17 is in contact with the electric field relaxation region 16 on the virtual line L1. The connection region 17 is in contact with the body region 12 or the contact region 18. The connection region 17 may be in contact with each of the body region 12 and the contact region 18. The connection region 17 is disposed between the electric field relaxation region 16 and the contact region 18. The connection region 17 is disposed closer to the second main surface 2 than the contact region 18 is. The connection region 17 is disposed closer to the first main surface 1 than the electric field relaxation region 16 is. For example, in the direction normal to the second main surface 2, the connection region 17 is disposed between the second region 18B and the electric field relaxation region 16 and may be in contact with each of the second region 18B and the electric field relaxation region 16. When the connection region 17 is disposed between the second region 18B and the electric field relaxation region 16 in the direction normal to the second main surface 2 and is in contact with each of the second region 18B and the electric field relaxation region 16, the series resistance between the second region 18B and the electric field relaxation region 16 is reduced. The effective concentration of the p-type impurity in the connection region 17 may be substantially equal to the effective concentration of the p-type impurity in the electric field relaxation region 16. The effective concentration of the p-type impurity in the connection region 17 is, for example, $5 \times 10^{17}$ cm$^{-3}$ or greater and $5 \times 10^{18}$ cm$^{-3}$ or less.

Assuming that the multiple gate trenches 5 arrayed in the first direction are a single gate trench assembly, it can be assumed that the gate trench assembly is separated into multiple gate trenches 5 by the second region 18B and the connection region 17.

The barrier metal film 84 covers the upper surface and side surfaces of the interlayer insulating film 83 and the side surfaces of gate insulating film 81. The barrier metal film 84 is in contact with each of the interlayer insulating film 83 and the gate insulating film 81. The barrier metal film 84 is formed of a material containing, for example, titanium nitride (TiN).

The source electrode 60 is in contact with the first main surface 1. The source electrode 60 includes a contact electrode 61 and a source wiring 62. The contact electrode 61 is in contact with the source region 13 and the first region 18A of the contact region 18 at the first main surface 1. The contact electrode 61 is formed of a material containing, for example, nickel silicide (NiSi). The contact electrode 61 may be formed of a material containing titanium (Ti), Al, and Si. The contact electrode 61 forms an ohmic junction with the source region 13 and the first region 18A of the contact region 18. The source wiring 62 covers the upper surface and side surfaces of the barrier metal film 84 and the upper surface of the contact electrode 61. The source wiring 62 is in contact with each of the barrier metal film 84 and the contact electrode 61. The source wiring 62 is formed of a material containing, for example, Al.

The passivation film 85 covers the upper surface of the source wiring 62. The passivation film 85 is in contact with the source wiring 62. The passivation film 85 is formed of a material containing, for example, polyimide.

The drain electrode 70 is in contact with the second main surface 2. The drain electrode 70 is in contact with the silicon carbide single crystal substrate 50 at the second main surface 2. The drain electrode 70 is electrically connected to the drift region 11. The drain electrode 70 is formed of a material containing, for example, NiSi. The drain electrode 70 may be formed of a material containing Ti, Al, and Si. The drain electrode 70 forms an ohmic junction with the silicon carbide single crystal substrate 50.

The upper end surface of the electric field relaxation region 16 may be spaced away from the bottom surface 4 in the direction normal to the second main surface 2. In this case, for example, the bottom surface 4 may be located in the drift region 11 and the side surfaces 3 may penetrate the source region 13 and the body region 12 to reach the drift region 11. For example, the third region 11C may be located between the upper end surface of the electric field relaxation region 16 and the bottom surface 4.

A buffer layer that contains an n-type impurity such as nitrogen and that is an n-type conductivity type may be provided between the silicon carbide single crystal substrate 50 and the fifth region 11E. The effective concentration of the n-type impurity in the buffer layer may be higher than the effective concentration of the n-type impurity in the fifth region 11E.

Next, a method of manufacturing the MOSFET 100 according to the embodiment will be described. FIGS. 9A to 9E, 10A to 10G, and 11A to 11H are cross-sectional views illustrating the method of manufacturing the MOSFET 100 according to the embodiment. FIGS. 9A to 9E illustrate common changes in the cross-section illustrated in FIG. 4 and in the cross-section illustrated in FIG. 6. FIGS. 10A to 10G illustrate changes in the cross-section illustrated in FIG. 4. FIGS. 11A to 11H illustrate changes in the cross-section illustrated in FIG. 6.

Figure 9A:
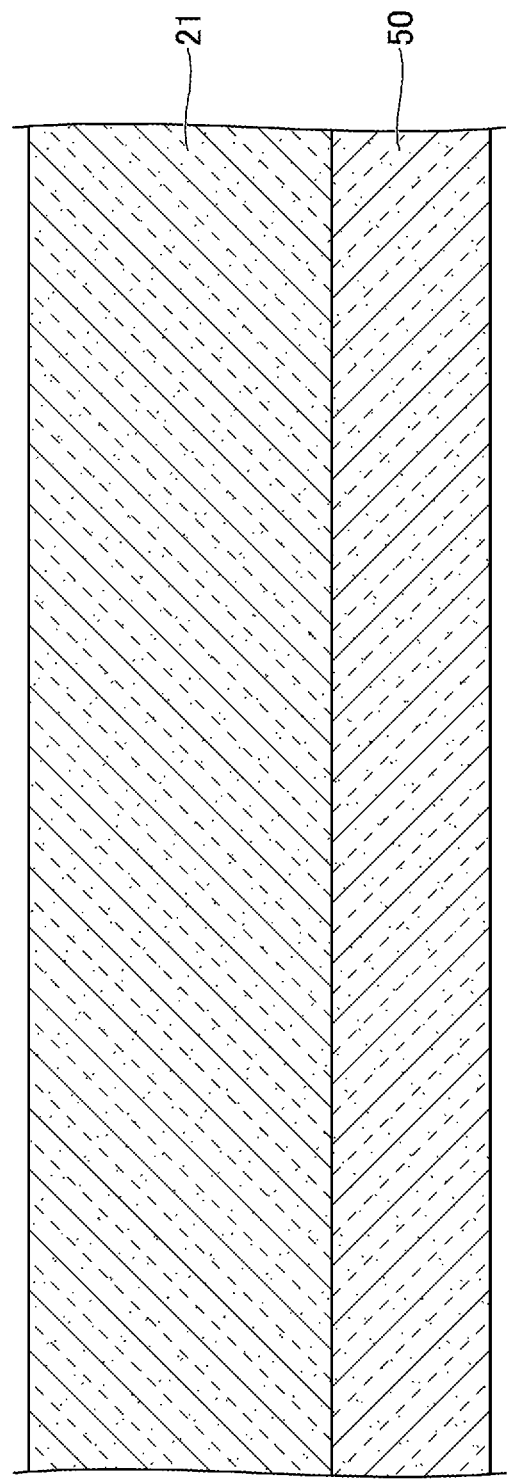
FIG. 9A is a cross-sectional view (part 1) illustrating a method for manufacturing the silicon carbide semiconductor device according to the embodiment.

First, as illustrated in FIG. 9A, a step of preparing the silicon carbide single crystal substrate 50 is performed. The silicon carbide single crystal substrate 50 is prepared, for example, by slicing a silicon carbide ingot (not illustrated) produced by the sublimation method. The buffer layer (not illustrated) may be formed on the silicon carbide single crystal substrate 50. The buffer layer can be formed by chemical vapor deposition (CVD) using, for example, a mixture of silane ($SiH_4$) and propane ($C_3H_8$) as a source gas and using, for example, hydrogen ($H_2$) as a carrier gas. During epitaxial growth of the buffer layer, an n-type impurity, e.g., nitrogen, may be introduced into the buffer layer.

Next, as also illustrated in FIG. 9A, a step of forming the first epitaxial layer 21 is performed. For example, the first epitaxial layer 21 is formed on the silicon carbide single crystal substrate 50 by CVD using, for example, a mixture of silane and propane as a source gas and using, for example, hydrogen as a carrier gas. During epitaxial growth, an n-type impurity, such as nitrogen, is introduced into the first epitaxial layer 21. The first epitaxial layer 21 is an n-type conductive type. The effective concentration of the n-type impurity in the first epitaxial layer 21 may be lower than the effective concentration of the n-type impurity in the buffer layer.

Figure 9B:
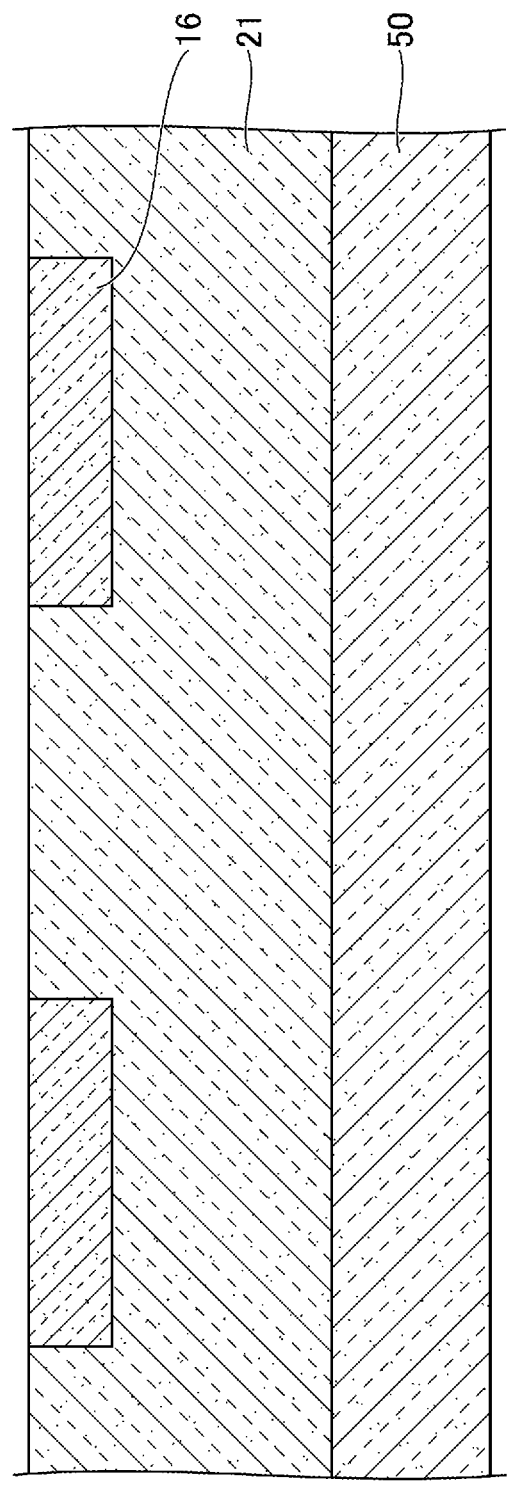
FIG. 9B is a cross-sectional view (part 2) illustrating the method for manufacturing the silicon carbide semiconductor device according to the embodiment.

Next, as illustrated in FIG. 9B, a step of forming the electric field relaxation region 16 is performed. For example, a mask layer (not illustrated), having openings on a region in which the electric field relaxation region 16 is formed, may be formed. Next, a p-type impurity ion such as an aluminum ion, which can impart a p-type, is implanted into the first epitaxial layer 21. This forms the electric field relaxation region 16.

Figure 9C:
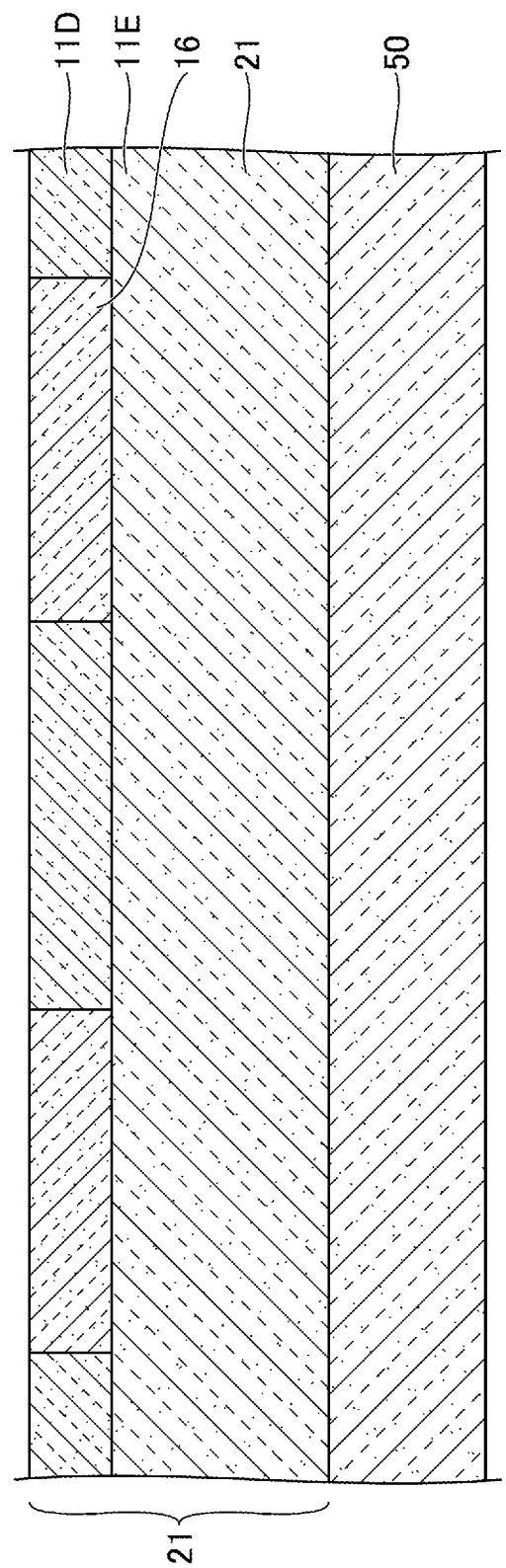
FIG. 9C is a cross-sectional view (part 3) illustrating the method for manufacturing the silicon carbide semiconductor device according to the embodiment.

Next, as illustrated in FIG. 9C, a step of forming the fourth region 11D is performed. For example, a mask layer (not illustrated) having an opening on a region in which the fourth region 11D is formed, i.e., a region on a side of the electric field relaxation region 16 in the direction parallel to the second main surface 2. Next, an n-type impurity ion such as nitrogen, which can impart an n-type, is implanted into the first epitaxial layer 21. This forms the fourth region 11D. In the first epitaxial layer 21, a portion on a silicon carbide single crystal substrate 50 side from the electric field relaxation region 16 and a portion on a silicon carbide single crystal substrate 50 side from the fourth region 11D are the fifth region 11E. The effective concentration of the n-type impurity in the fourth region 11D is higher than the effective concentration of the n-type impurity in the fifth region 11E.

Figure 9D:
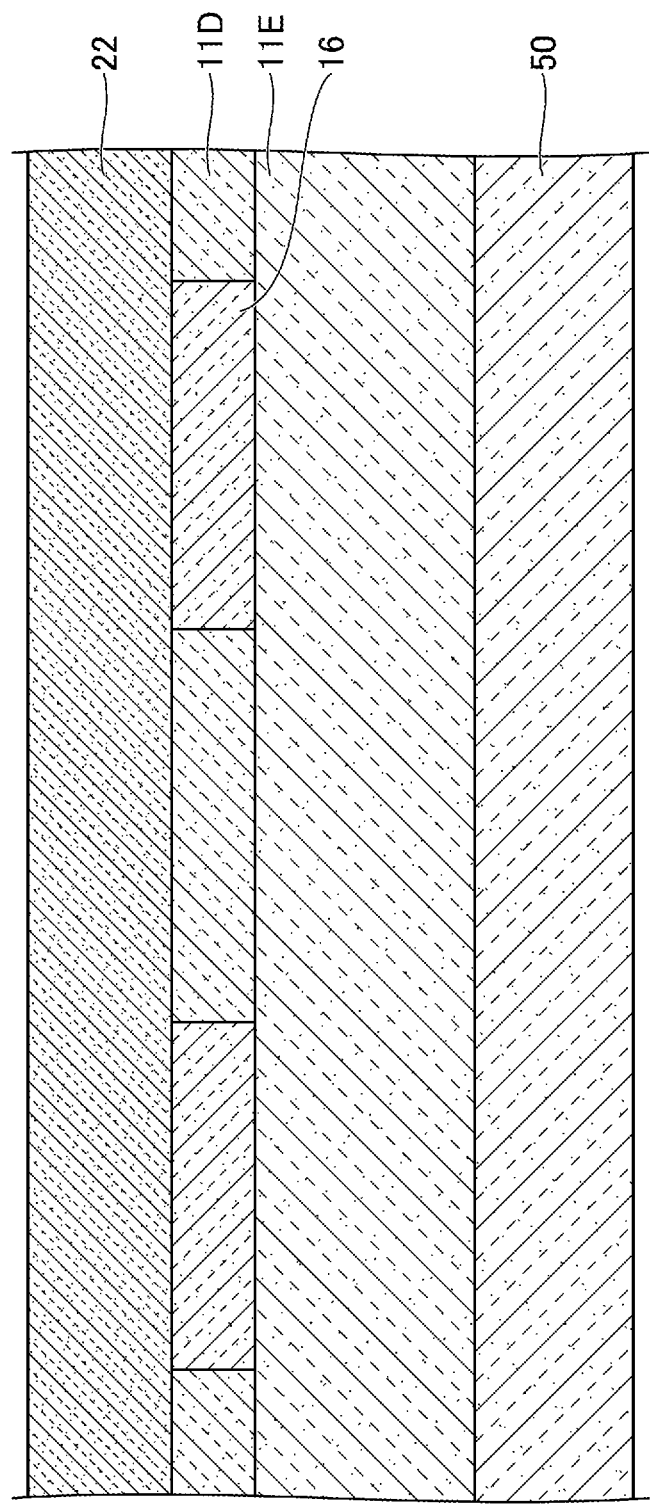
FIG. 9D is a cross-sectional view (part 4) illustrating the method for manufacturing the silicon carbide semiconductor device according to the embodiment.

Next, as illustrated in FIG. 9D, a step of forming the second epitaxial layer 22 is performed. The second epitaxial layer 22 is formed on the first epitaxial layer 21 by CVD using, for example, a mixture of silane and propane as a source gas and using, for example, hydrogen as a carrier gas. During epitaxial growth, an n-type impurity such as nitrogen is introduced into the second epitaxial layer 22. The second epitaxial layer 22 is an n-type conductive type. The thickness of the second epitaxial layer 22 is 0.8 μm or greater and 1.2 μm or less, for example. The effective concentration of the n-type impurity in the second epitaxial layer 22 is made less than the effective concentration of the n-type impurity in the fourth region 11D, for example.

Figure 9E:
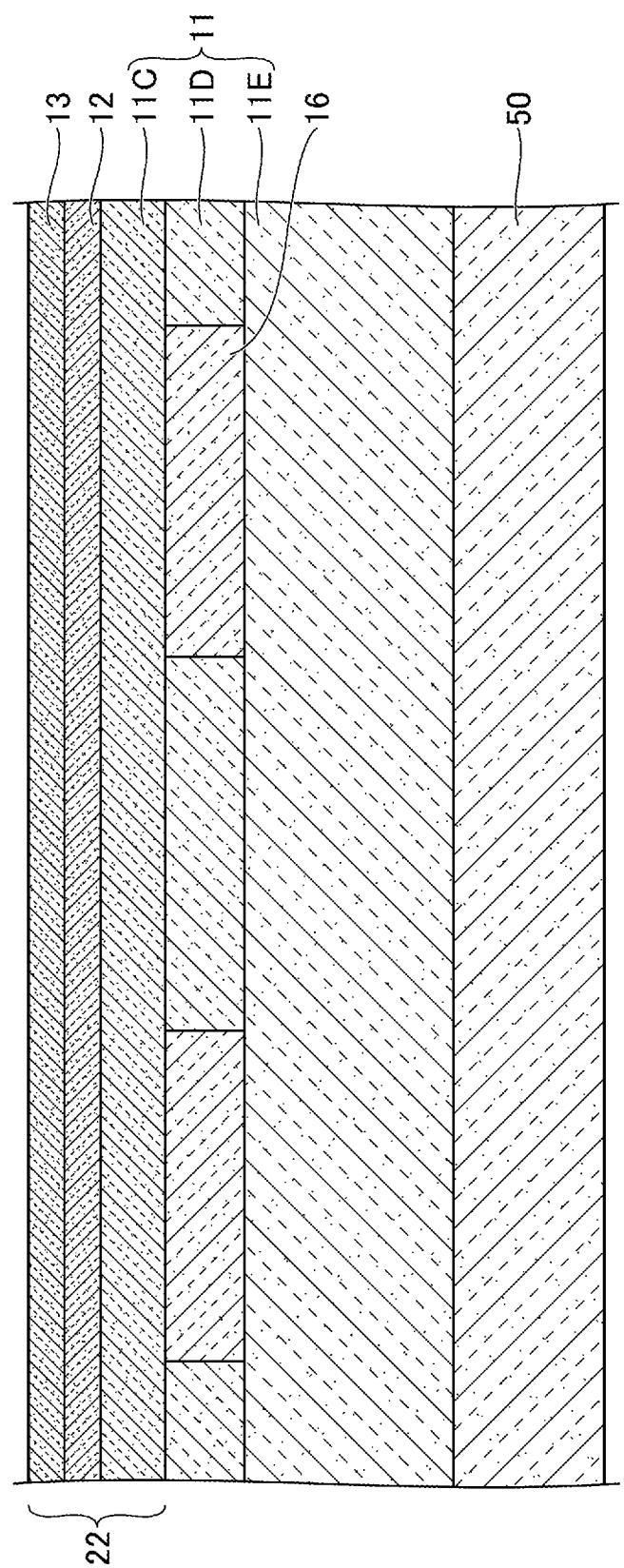
FIG. 9E is a cross-sectional view (part 5) illustrating the method for manufacturing the silicon carbide semiconductor device according to the embodiment.

Next, as illustrated in FIG. 9E, a step of forming the body region 12 is performed. A p-type impurity ion such as an aluminum ion, which can impart a p-type, is implanted into the entire surface of the second epitaxial layer 22. This forms the body region 12.

Next, as also illustrated in FIG. 9E, a step of forming the source region 13 is performed. An n-type impurity ion such as phosphorus, which can impart an n-type, is implanted into the entire surface of the second epitaxial layer 22. This forms the source region 13.

Figure 11A:
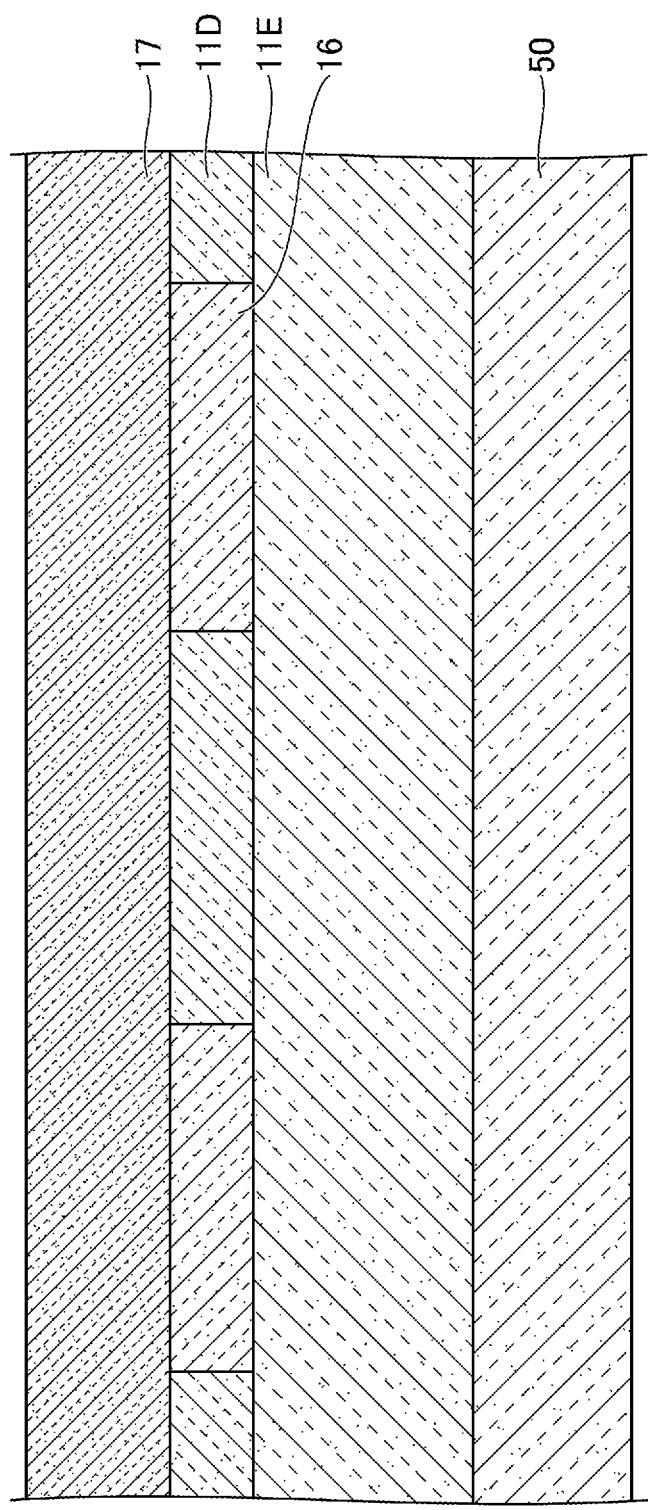
FIG. 11A is a cross-sectional view (part 13) illustrating the method for manufacturing a silicon carbide semiconductor device according to the embodiment.

Next, as illustrated in FIG. 11A, a step of forming the connection region 17 is performed. For example, a mask layer (not illustrated), having an opening on a region in which the connection region 17 is formed, is formed. Next, a p-type impurity ion such as an aluminum ion, which can impart a p-type, is implanted into the source region 13, the body region 12, and the third region 11C. This forms the connection region 17 that is in contact with the body region 12 and the electric field relaxation region 16.

Figure 11B:
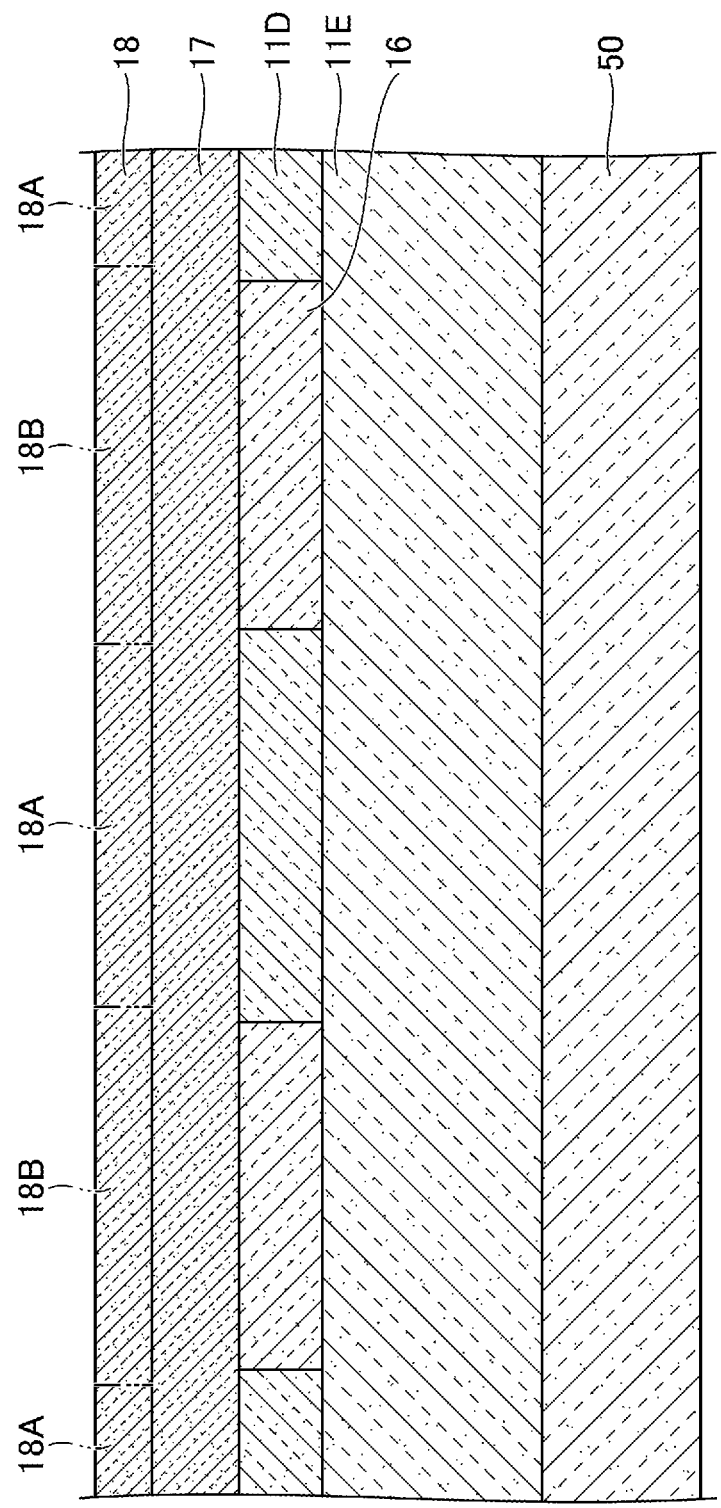
FIG. 11B is a cross-sectional view (part 14) illustrating the method for manufacturing a silicon carbide semiconductor device according to the embodiment.

Next, as illustrated in FIG. 11B, a step of forming the contact region 18 is performed. For example, a mask layer (not illustrated), having an opening on a region in which the contact region 18 is formed, is formed. Next, a p-type impurity ion such as an aluminum ion, which can impart a p-type, is implanted into the connection region 17. This forms the contact region 18 that is in contact with the body region 12 and the connection region 17.

Next, the activating anneal is performed to activate the impurity ions implanted into the silicon carbide substrate 10. The temperature of the activating anneal is preferably 1500° C. or greater and 1900° C. or less, for example, about 1700° C. The time duration of the activating anneal is, for example, about 30 minutes. The atmosphere of the activating anneal is preferably an inert gas atmosphere, for example, an Ar atmosphere.

Figure 10A:
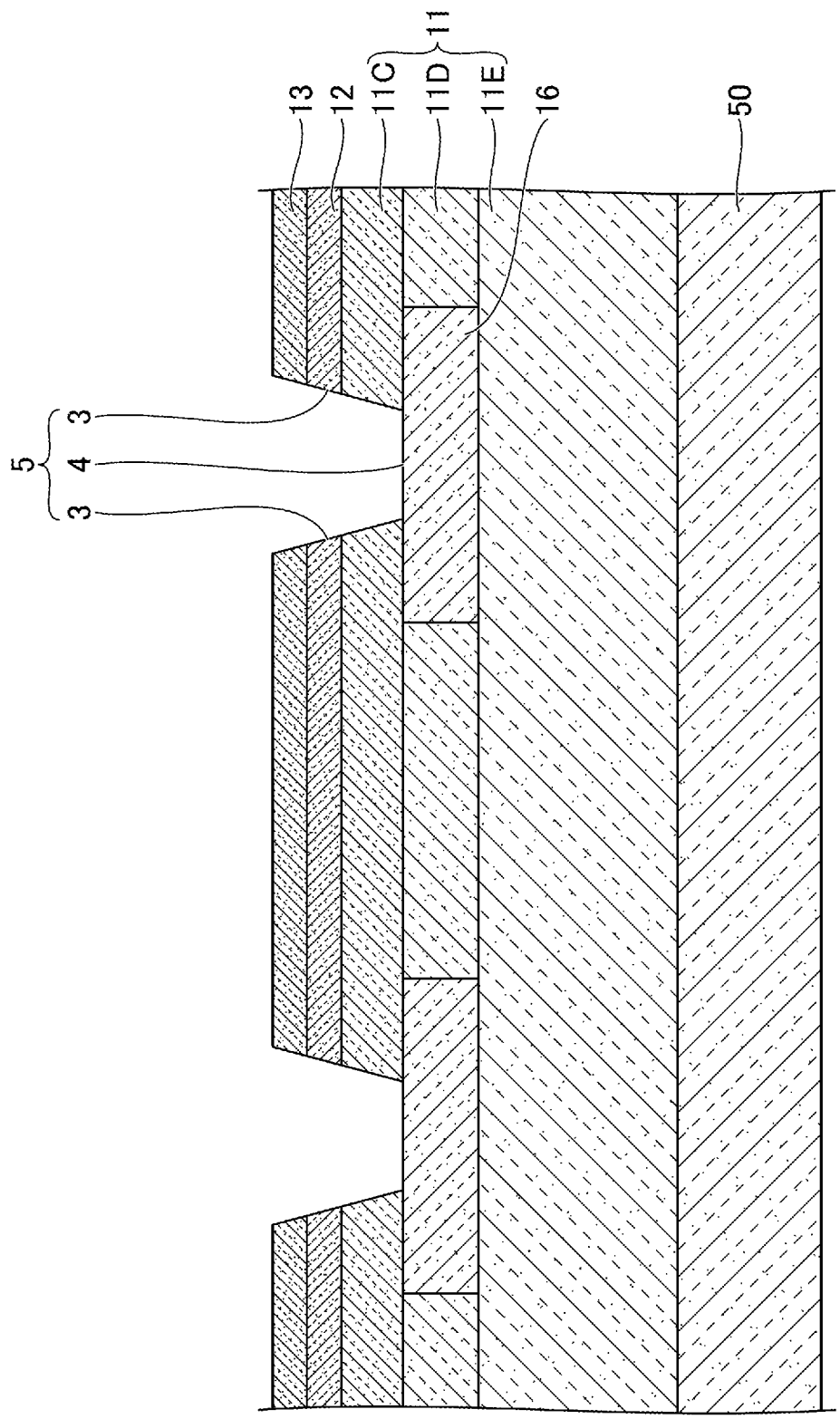
FIG. 10A is a cross-sectional view (part 6) illustrating the method for manufacturing the silicon carbide semiconductor device according to the embodiment.

Next, as illustrated in FIG. 10A, a step of forming the gate trench 5 is performed. For example, a mask layer (not illustrated) having an opening on a position where the gate trench 5 is formed in the first main surface 1 formed by the source region 13 and the contact region 18. The mask layer is used to remove a portion of the source region 13, a portion of the body region 12, and a portion of the drift region 11 by etching. As an etching method, for example, reactive ion etching, particularly inductively coupled plasma reactive ion etching can be used. Specifically, inductively coupled plasma reactive ion etching using, for example, sulfur hexafluoride ($SF_6$) or a mixture of $SF_6$ and oxygen ($O_2$) as a reactive gas can be used. The etching forms a recess (not illustrated) having sides substantially normal to the first main surface 1 and a bottom that is provided continuous to the sides and that is substantially parallel to the first main surface 1 in a region where the gate trench 5 is to be formed.

Next, thermal etching is performed in the recess. The thermal etching can be performed, in a state in which the mask layer is formed on the first main surface 1, for example, by heating in an atmosphere including a reactive gas containing at least one or more kinds of halogen atoms. The at least one or more halogen atoms includes at least either a chlorine (Cl) atom or a fluorine (F) atom. The atmosphere includes, for example, chlorine ($Cl_2$), boron trichloride ($BCl_3$), $SF_6$, or tetrafluoromethane ($CF_4$). For example, a mixture of a chlorine gas and an oxygen gas is used as a reactive gas and the thermal etching is performed with a heat treatment temperature of, for example, between 800° C. and 900° C. Here, the reactive gas may include a carrier gas in addition to the above-described chlorine gas and oxygen gas. As the carrier gas, for example, a nitrogen gas, an argon gas, or a helium gas may be used.

The above-described thermal etching forms the gate trench 5 in the first main surface 1 of the silicon carbide substrate 10. The gate trench 5 is defined by the side surfaces 3 and the bottom surface 4. The side surface 3 is formed by the source region 13, the body region 12, and the drift region 11. The bottom surface 4 is formed by the electric field relaxation region 16. The angle θ1 between the side surface 3 and a plane including the bottom surface 4 is, for example, 45° or greater and 65° or less. Next, the mask layer is removed from the first main surface 1.

Figure 10B:
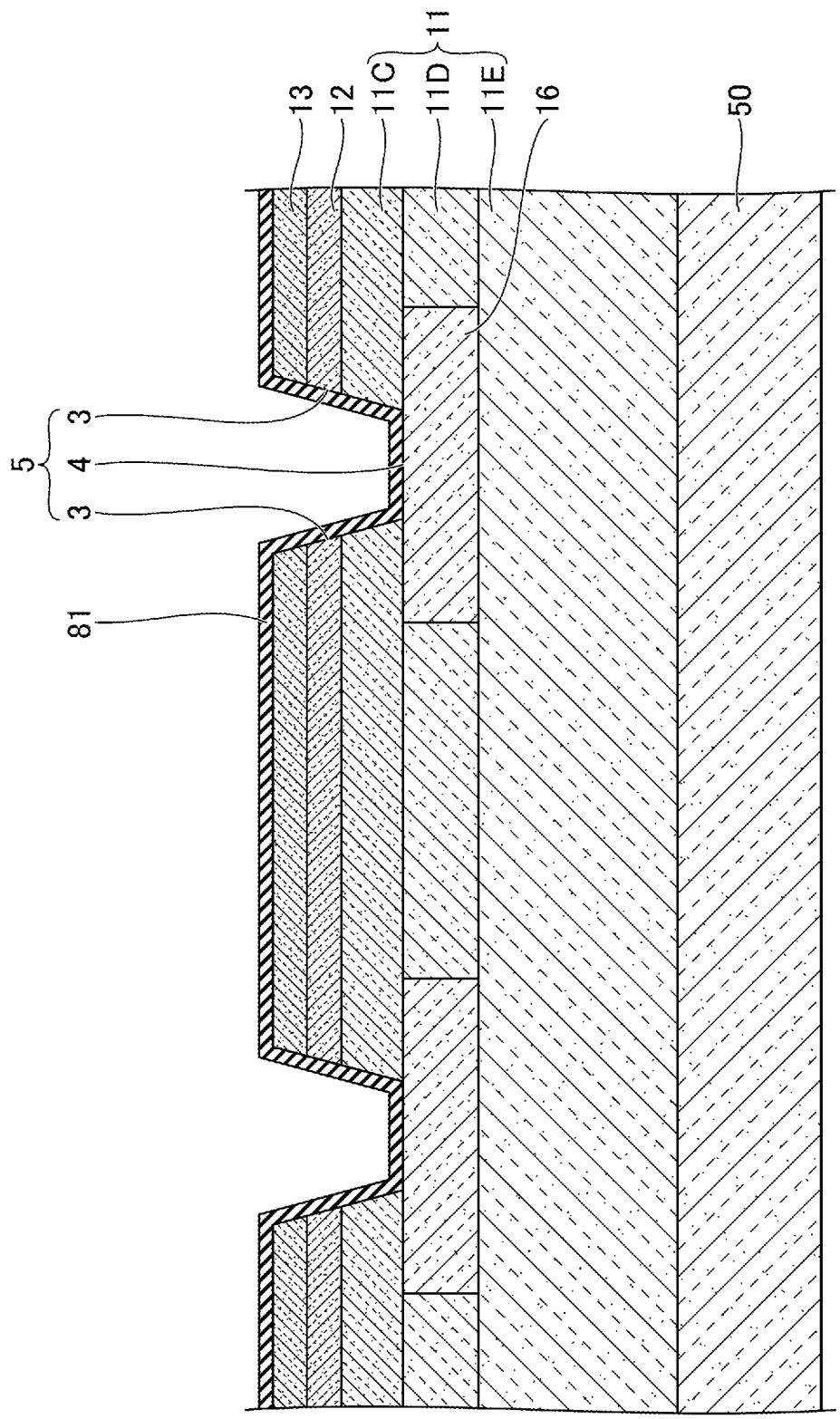
FIG. 10B is a cross-sectional view (part 7) illustrating the method for manufacturing a silicon carbide semiconductor device according to the embodiment.

Next, as illustrated in FIG. 10B and FIG. 11C, a step of forming the gate insulating film 81 is performed. For example, thermal oxidation of the silicon carbide substrate 10 is performed, so that the gate insulating film 81 that is in contact with the source region 13, the body region 12, the drift region 11, the electric field relaxation region 16, and the contact region 18 is formed. Specifically, the silicon carbide substrate 10 is heated in an atmosphere containing oxygen, for example, at a temperature of 1300° C. or greater and 1400° C. or less. This forms the gate insulating film 81 that is contact with the first main surface 1, the side surfaces 3, and the bottom surface 4.

Next, a heat treatment (the NO anneal) may be performed on the silicon carbide substrate 10 in a nitric oxide (NO) gas atmosphere. In the NO anneal, the silicon carbide substrate 10 is retained, for example, under a condition of 1100° C. or greater and 1400° C. or less for about one hour. This introduces nitrogen atoms into an interface region between the gate insulating film 81 and the body region 12. As a result, the formation of the interface level in the interface region is suppressed, so that channel mobility can be improved.

Figure 11D:
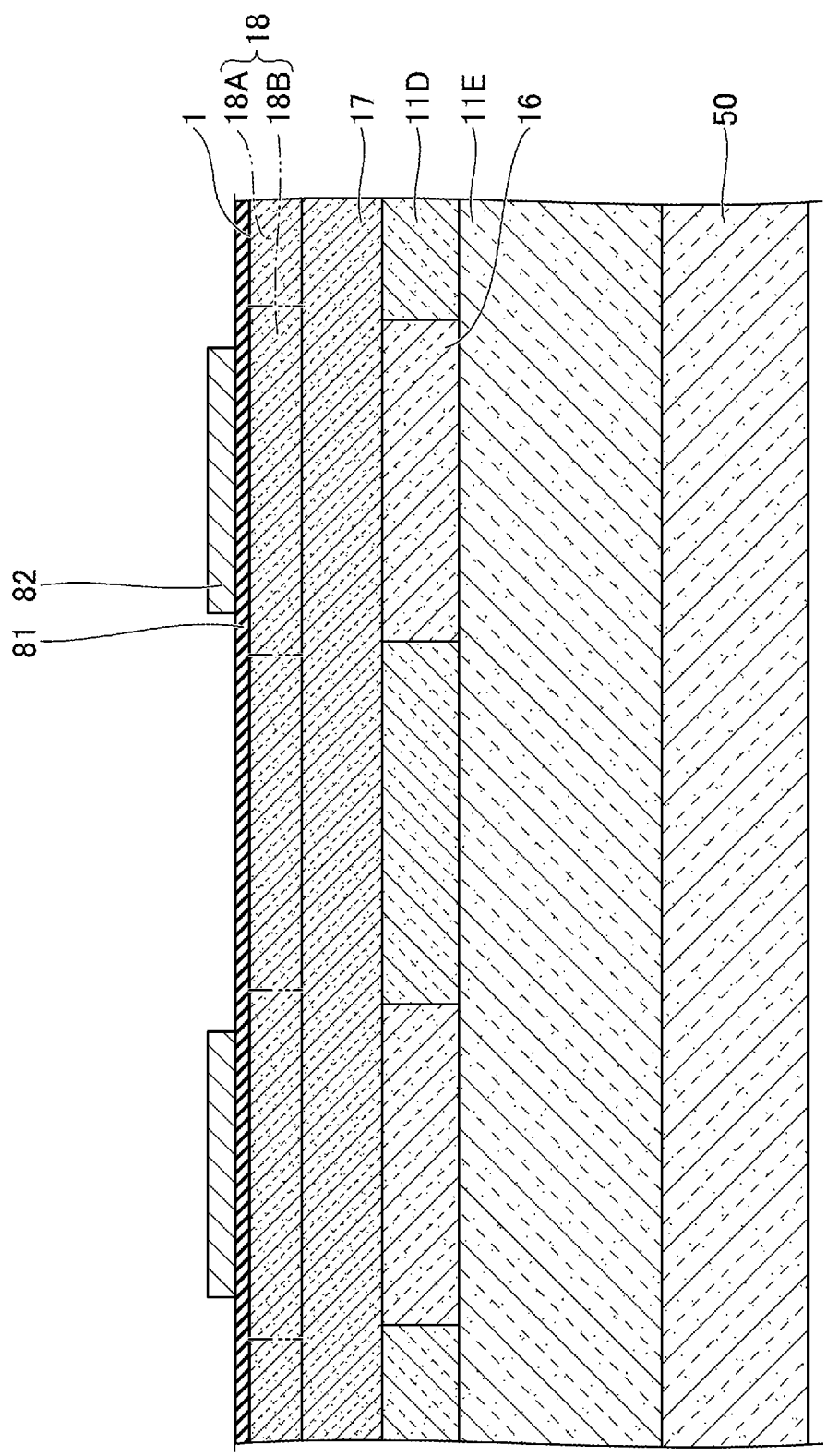
FIG. 11D is a cross-sectional view (part 16) illustrating the method for manufacturing a silicon carbide semiconductor device according to the embodiment.

Next, as illustrated in FIG. 10C and FIG. 11D, a step of forming the gate electrode 82 is performed. The gate electrode 82 is formed on the gate insulating film 81. The gate electrode 82 is formed, for example, by low pressure chemical vapor deposition (LP-CVD). The gate electrode 82 is formed so as to be opposing each of the source region 13, the body region 12, and the drift region 11.

Figure 11E:
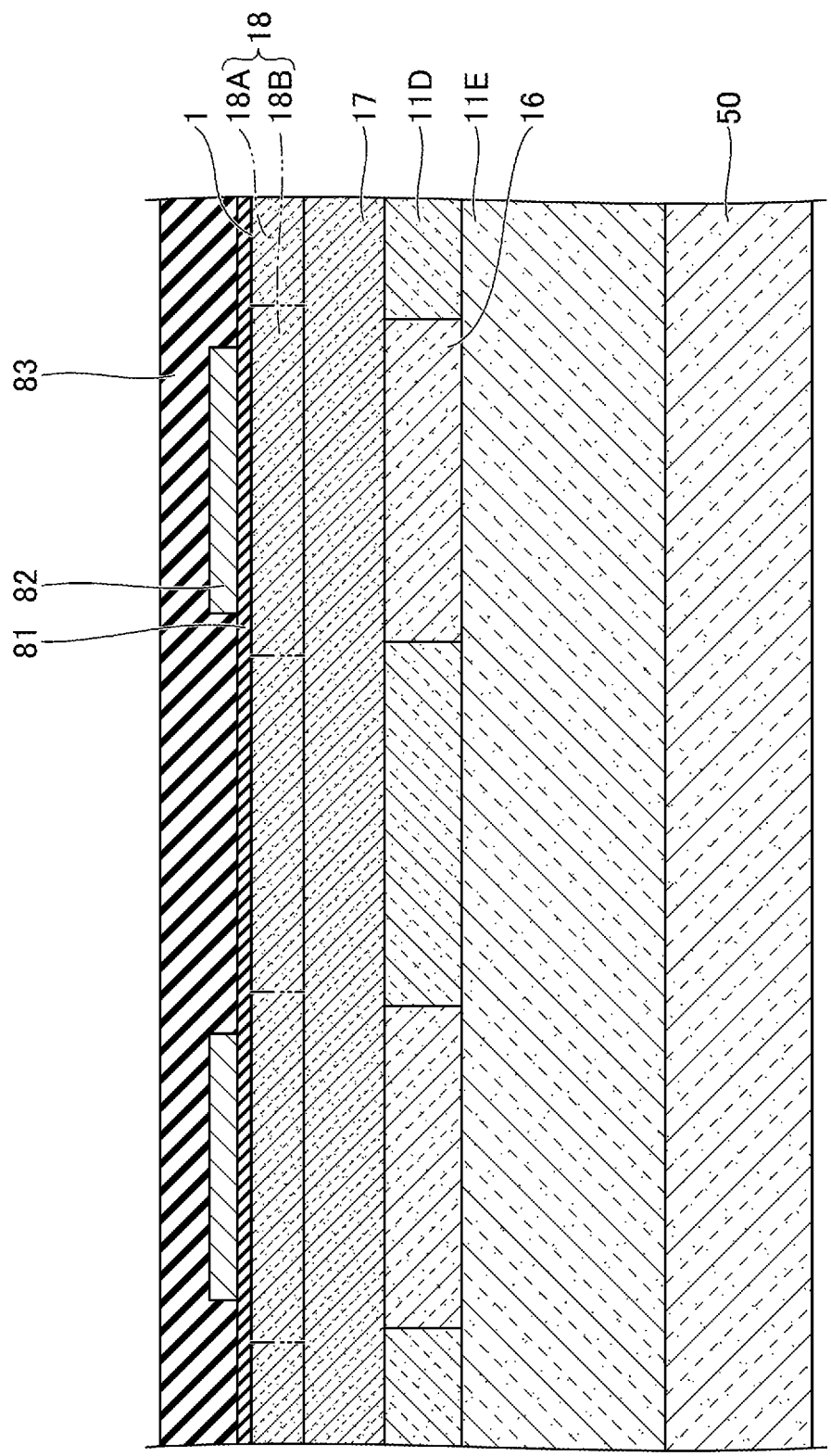
FIG. 11E is a cross-sectional view (part 17) illustrating the method for manufacturing a silicon carbide semiconductor device according to the embodiment.

Next, as illustrated in FIG. 10D and FIG. 11E, a step of forming the interlayer insulating film 83 is performed. Specifically, the interlayer insulating film 83 is formed to cover the gate electrode 82 and to be in contact with the gate insulating film 81. The interlayer insulating film 83 is formed, for example, by CVD. The interlayer insulating film 83 is formed of a material containing, for example, silicon dioxide. A portion of the interlayer insulating film 83 may be formed inside the gate trench 5.

Figure 10E:
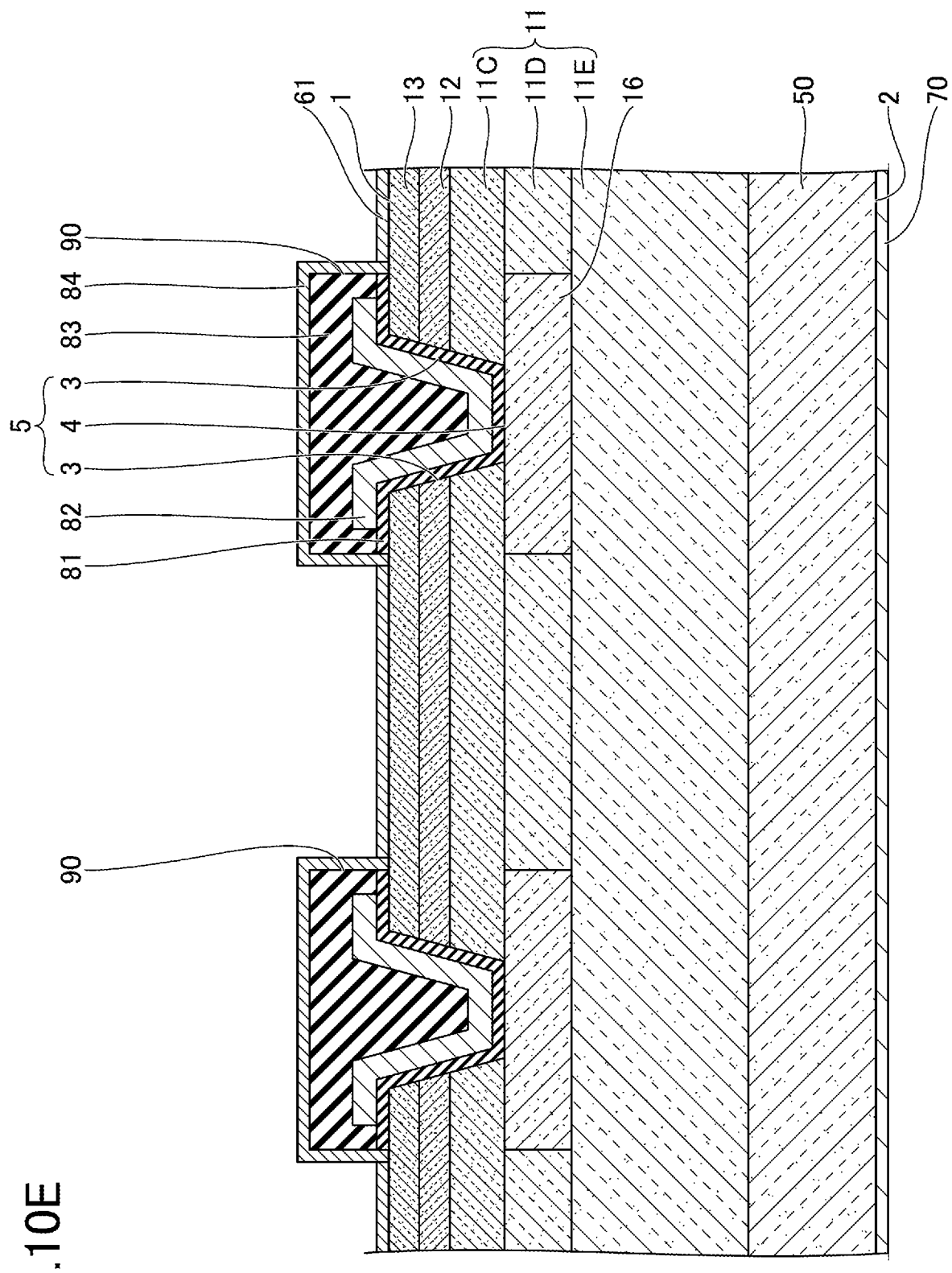
FIG. 10E is a cross-sectional view (part 10) illustrating the method for manufacturing a silicon carbide semiconductor device according to the embodiment.
Figure 11F:
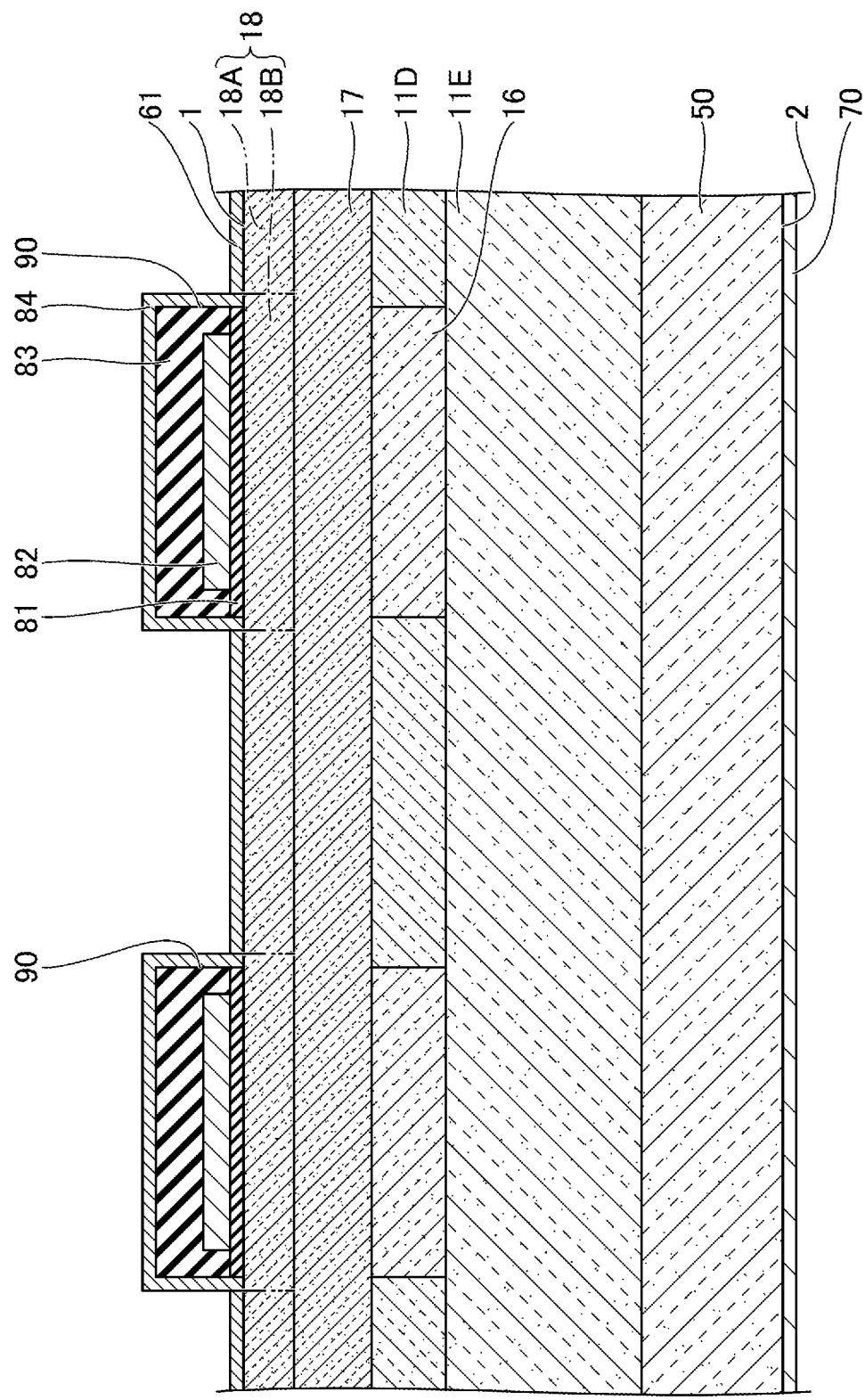
FIG. 11F is a cross-sectional view (part 18) illustrating the method for manufacturing a silicon carbide semiconductor device according to the embodiment.

Next, as illustrated in FIG. 10E and FIG. 11F, a step of forming the barrier metal film 84, the contact electrode 61, and the drain electrode 70 is performed. For example, etching is performed to form the contact hole 90 in the interlayer insulating film 83 and the gate insulating film 81, so that the source region 13 and the first region 18A in the contact hole 90 are exposed from the interlayer insulating film 83 and gate insulating film 81. Next, the barrier metal film 84 that covers the upper and side surfaces of the interlayer insulating film 83 and the side surfaces of the gate insulating film 81 is formed. The barrier metal film 84 is formed of a material containing, for example, TiN. The barrier metal film 84 is formed by, for example, sputtering deposition and reactive ion etching (RIE). Next, a metal film for the contact electrode 61 (not illustrated) that is contact with the source region 13 and the first region 18A at the first main surface 1 is formed. The metal film for the contact electrode 61 is formed, for example, by sputtering. The metal film for the contact electrode 61 is formed of a material containing, for example, Ni. Next, a metal film for the drain electrode 70 (not illustrated) that is in contact with the silicon carbide single crystal substrate 50 at the second main surface 2 is formed. The metal film for the drain electrode 70 is formed, for example, by sputtering. The metal film for the drain electrode 70 is formed of a material containing, for example, Ni.

Next, alloying anneal is performed. The metal film for the contact electrode 61 and the metal film for the drain electrode 70 are retained, for example, at a temperature of 900° C. or greater and 1100° C. or less for about 5 minutes. This causes at least a portion of the metal film for the contact electrode 61 and at least a portion of the metal film for the drain electrode 70 to react with silicon contained in the silicon carbide substrate 10 to silicide. This forms the contact electrode 61 that forms an ohmic junction with the source region 13 and the first region 18A and the drain electrode 70 that forms an ohmic junction with the silicon carbide single crystal substrate 50. The contact electrode 61 may be formed of a material containing Ti, Al, and Si. The drain electrode 70 may be formed of a material containing Ti, Al, and Si.

Figure 10F:
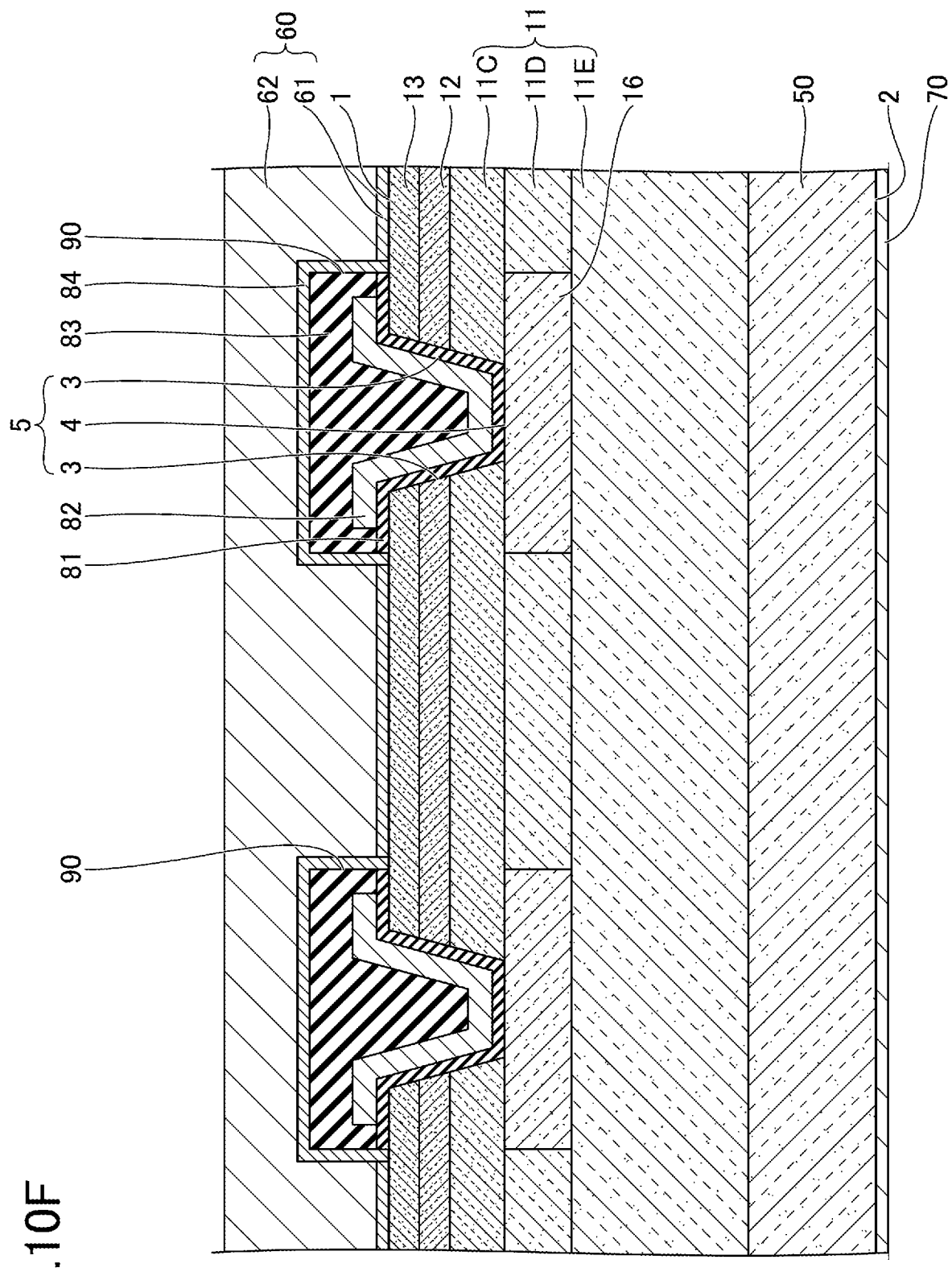
FIG. 10F is a cross-sectional view (part 11) illustrating the method for manufacturing a silicon carbide semiconductor device according to the embodiment.
Figure 11G:
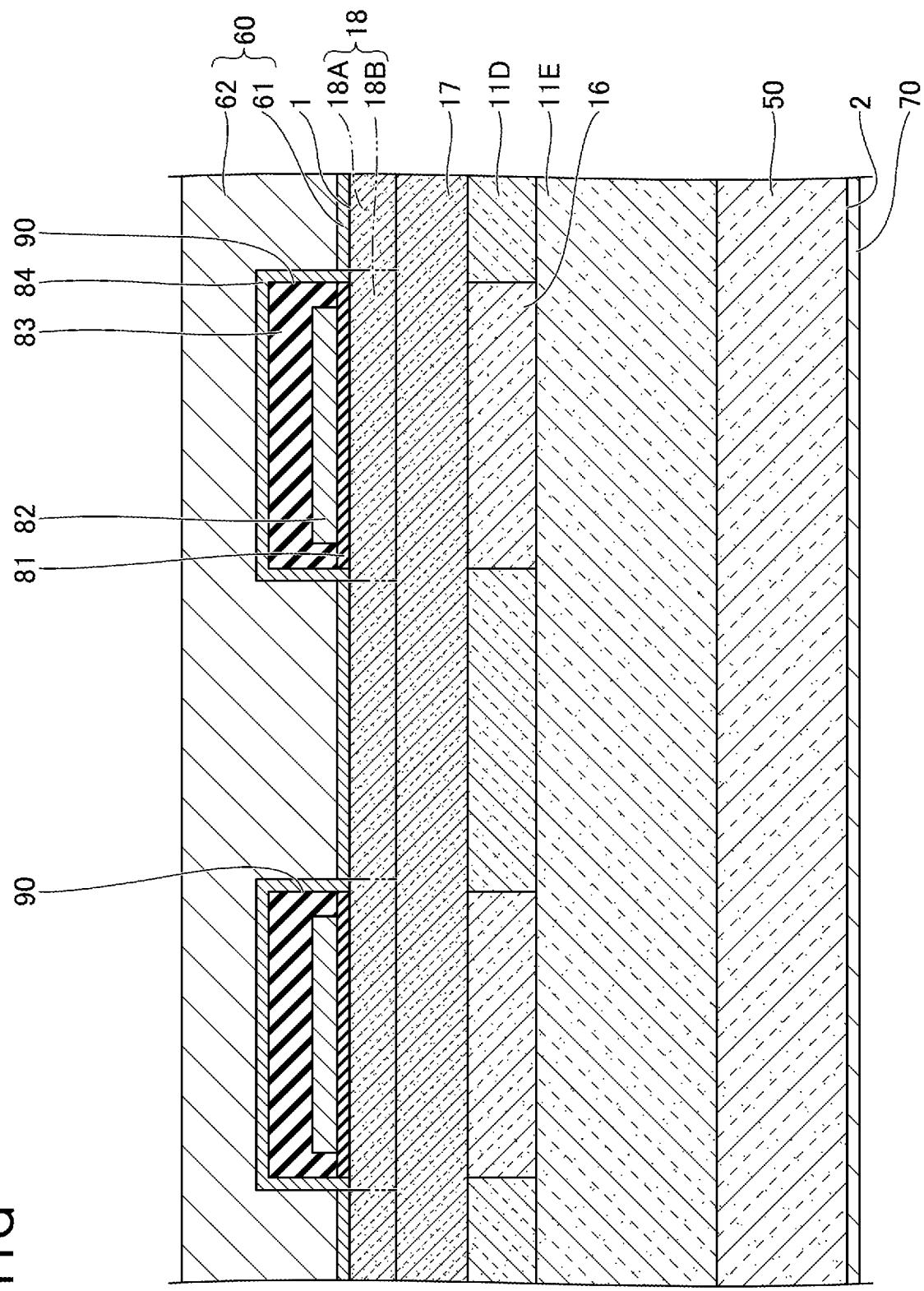
FIG. 11G is a cross-sectional view (part 19) illustrating the method for manufacturing a silicon carbide semiconductor device according to the embodiment.

Next, as illustrated in FIG. 10F and FIG. 11G, a step of forming the source wiring 62 is performed. Specifically, the source wiring 62 covering the contact electrode 61 and the barrier metal film 84 is formed. The source wiring 62 is formed, for example, by sputtering deposition and RIE. The source wiring 62 is formed of a material containing, for example, aluminum. As described, the source electrode 60 including the contact electrode 61 and the source wiring 62 is formed.

Figure 10G:
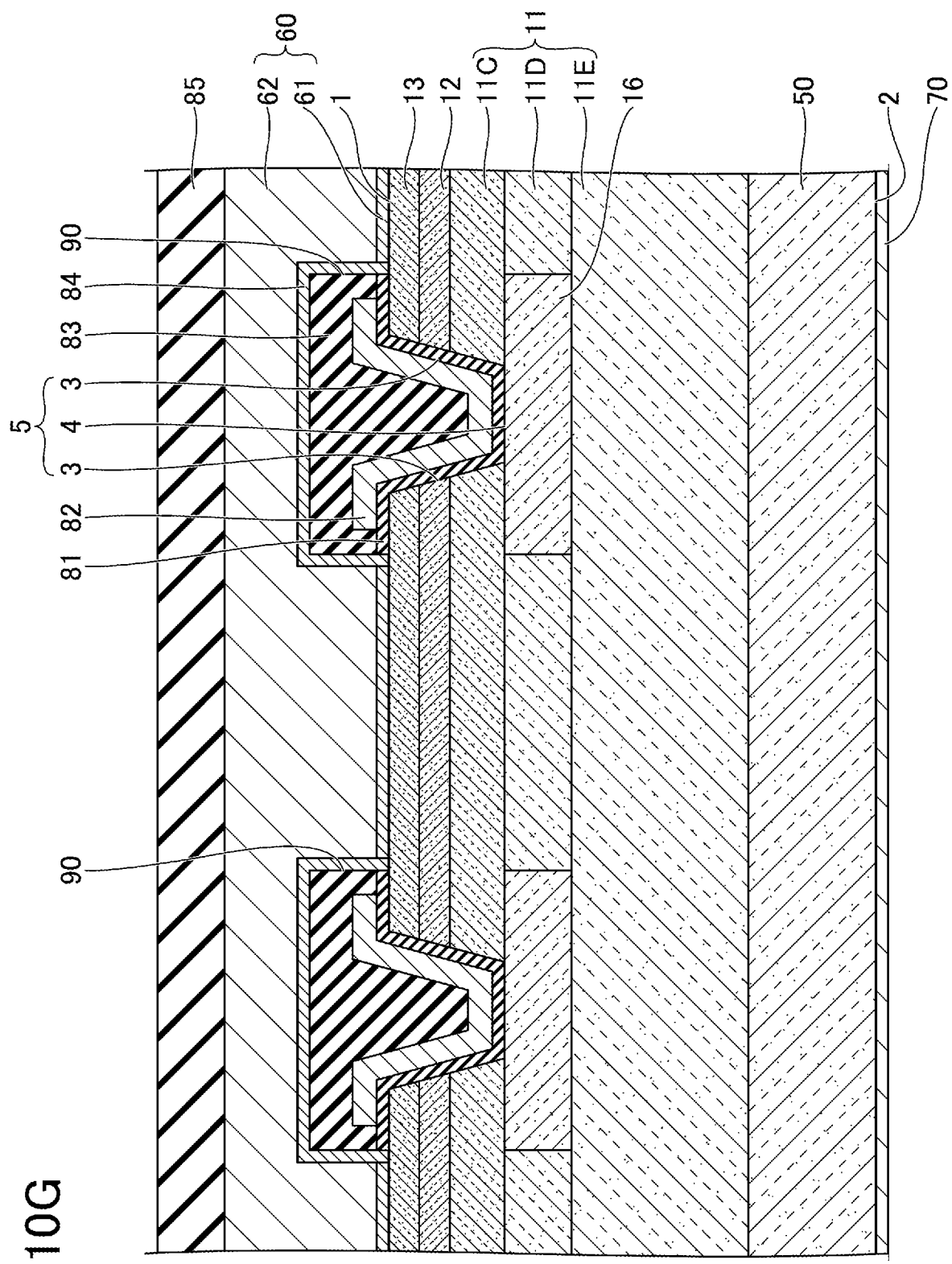
FIG. 10G is a cross-sectional view (part 12) illustrating the method for manufacturing a silicon carbide semiconductor device according to the embodiment.
Figure 11H:
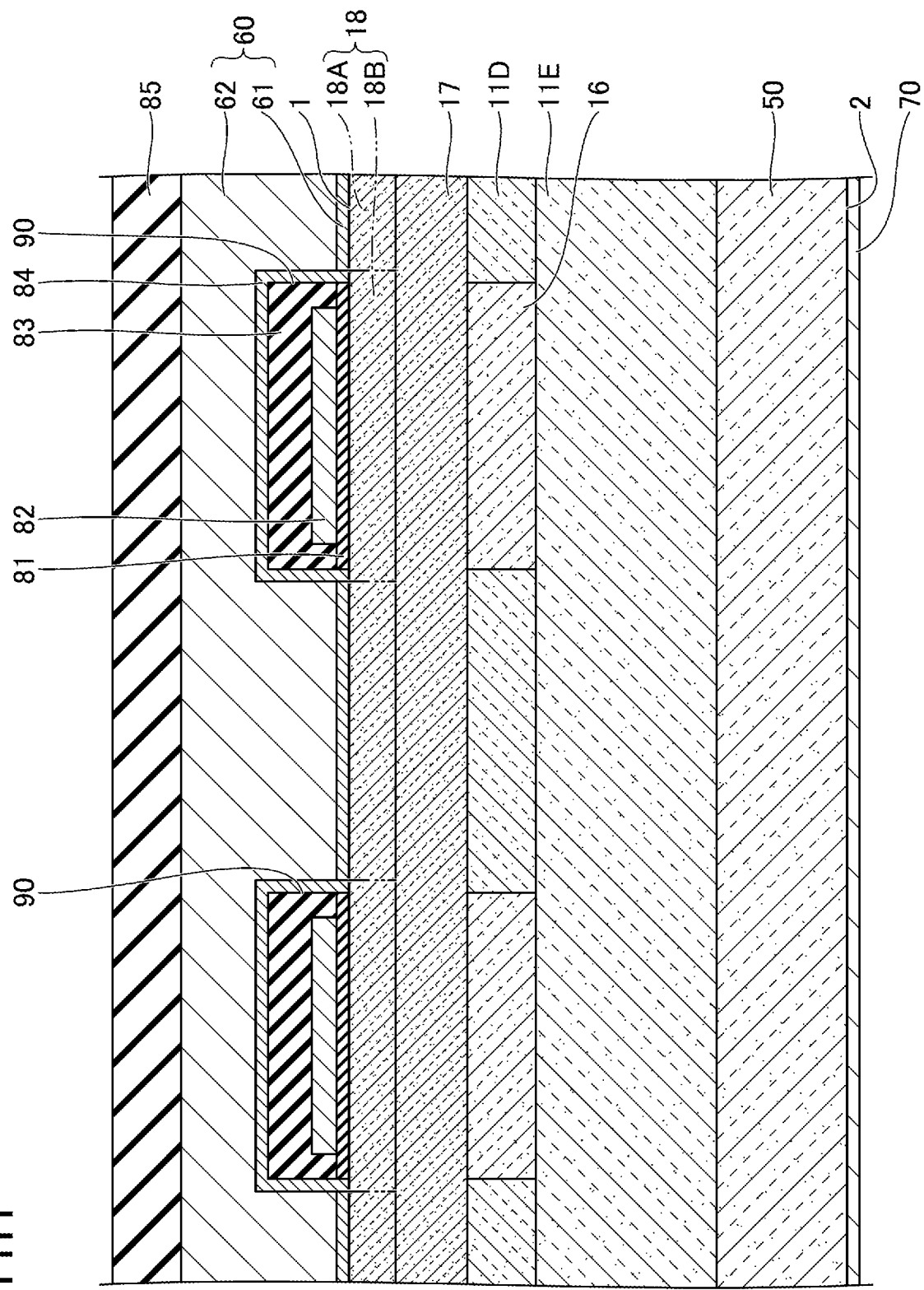
FIG. 11H is a cross-sectional view (part 20) illustrating the method for manufacturing a silicon carbide semiconductor device according to the embodiment.

Next, as illustrated in FIG. 10G and FIG. 11H, a step of forming the passivation film 85 is performed. Specifically, the passivation film 85 covering the source wiring 62 is formed. The passivation film 85 is formed of a material containing, for example, polyimide. The passivation film 85 is formed, for example, by a coating process. The passivation film 85 may be formed by plasma CVD.

As described, the MOSFET 100 according to the embodiment is completed.

Next, the effect of the MOSFET according to the present embodiment will be described.

In the MOSFET 100 according to the present embodiment, the contact region 18 and the electric field relaxation region 16 are electrically connected through the connection region 17. The contact region 18 is electrically connected to the source electrode 60. Thus, the electric field relaxation region 16 is electrically connected to the source electrode 60. Therefore, the carrier can be supplied from the source electrode 60 to the electric field relaxation region 16 to reduce the feedback capacity. Reduction of the feedback capacity reduces switching loss and improves the switching speed.

Additionally, the gate trench 5 and the electric field relaxation region 16 are disposed on the virtual line L1. That is, the gate trench 5 and the electric field relaxation region 16 overlap the virtual line L1. Then, the connection region 17 is in contact with the electric field relaxation region 16 on the virtual line L1. Thus, the connection region 17 is unlikely to inhibit drain current flowing along a portion of the side surface 3 that is parallel to the first direction, i.e., a portion of the side surface 3 that is spaced away from an end of the gate trench 5 in the first direction. Therefore, sufficient drain current can be obtained when turned on.

The connection region 17 is provided between the gate trenches 5 adjacent in the first direction in the plan view in the direction normal to the first main surface 1. The connection region 17 may be provided to overlap the gate trench 5 in the plan view in the direction normal to the first main surface 1, but when provided between the gate trenches 5, the volume of the connection region 17 may increase and the electrical resistance at the connection region 17 may be reduced. Additionally, if there are the source region 13, the body region 12, and the drift region 11 between the end of the gate trench 5 in the first direction and the second region 18B, the drain current can also flow in a region between the gate trench 5 and the second region 18B in the first direction.

In the present embodiment, a semiconductor region provided near an upper end of the gate trench 5 is the n-type source region 13. Although the p-type contact region 18 may be provided near the upper end of the gate trench 5, the gate insulating film 81 is more likely to be thinner on the p-type contact region 18 than on the n-type source region 13. Additionally, the electric field easily concentrates near the upper end of the gate trench 5. The semiconductor region provided near the upper end of the gate trench 5 is the n-type source region 13, so that the thick gate insulating film 81 is easily formed, and thus the electrical breakdown of the gate insulating film 81 caused by the electric field concentration near the upper end of the gate trench 5 can be prevented.

The first region 18A is provided on each side of the gate trench 5 in the second direction. Thus, compared to a case in which the first region 18A is provided only on one side of the gate trench 5 in the second direction, the electrical resistance between the source electrode 60 and the electric field relaxation region 16 can be reduced.

The connection region 17 is disposed between the second region 18B and the electric field relaxation region 16 in the direction normal to the second main surface 2 and is in contact with each of the second region 18B and the electric field relaxation region 16, so that the serial resistance between the second region 18B and the electric field relaxation region 16 can be reduced.

The first effective concentration of the p-type impurity in the contact region 18 is preferably higher than the second effective concentration of the p-type impurity in the connection region 17. The first effective concentration is high, so that the contact resistance between the contact region 18 and the contact electrode 61 can be reduced. If the second effective concentration is as high as the first effective concentration, leakage current tends to flow due to the introduction of crystal defects.

The first dimension Wp1 of the first region 18A in the first direction is preferably greater than the second dimension Wp2 of the second region 18B in the first direction. The contact electrode 61 forms an ohmic junction with the first region 18A, so that, as the first dimension Wp1 increases, the contact resistance between the first region 18A and the contact electrode 61 is reduced. With respect to the above, the second region 18B is provided between the gate trenches 5 adjacent in the first direction, so that when the second dimension Wp2 is as great as the first dimension Wp1, a range where the drain current flows is narrowed, and thus sufficient drain current may not be easily obtained. The first dimension Wp1 is greater than the second dimension Wp2, so that a wide range where the drain current flows when turned on can be obtained while reducing the contact resistance between the first region 18A and the source electrode 60. Therefore, the first dimension Wp1 is preferably greater than the second dimension Wp2.

For example, the first dimension Wp1 is preferably 1 or greater times and 6 or less times the second dimension Wp2. If the first dimension Wp1 is greater than 6 times the second dimension Wp2, a region in which the contact electrode 61 forms an ohmic junction with the source region 13 inside the contact hole 90 becomes small, and the contact resistance between the source region 13 and the contact electrode 61 may increase. The first dimension Wp1 is 1 or greater and 6 or less times the second dimension Wp2, so that a wide range where the drain current flows when turned on can be obtained while reducing the contact resistance between the first region 18A and the source electrode 60, and the contact resistance between the source region 13 and the source electrode 60 can be further reduced. Thus, the first dimension Wp1 is more preferably two or greater and five or less times the second dimension Wp2.

For example, the first dimension Wp1 is preferably greater than the third dimension Wn of the source region 13 in the first direction. Generally, p-type impurities are less active than n-type impurities. The first dimension Wp1 is greater than the third dimension Wn, so that the contact resistance between the first region 18A and the contact electrode 61 and the contact resistance between the source region 13 and the contact electrode 61 can each be kept low.

For example, the first dimension Wp1 is preferably 0.2 or greater and 0.6 or less times the sum Wch of the first dimension Wp1 and the third dimension Wn. If the first dimension Wp1 is less than 0.2 times the sum Wch, the contact resistance between the first region 18A and the contact electrode 61 may be too high. If the first dimension Wp1 is greater than 0.6 times the sum Wch, the contact resistance between the source region 13 and the contact electrode 61 may be too high. The first dimension Wp1 is 0.2 or greater and 0.6 or less times the sum Wch, so that the contact resistance between the first region 18A and the contact electrode 61 and the contact resistance between the source region 13 and the contact electrode 61 can each be kept low. More preferably, the first dimension Wp1 is 0.3 or greater and 0.6 or less times the sum Wch.

By including the {0-33-8} plane in the side surface 3 of the gate trench 5, excellent mobility for the channel can be obtained and the channel resistance can be reduced.

First Modified Example

Figure 12:
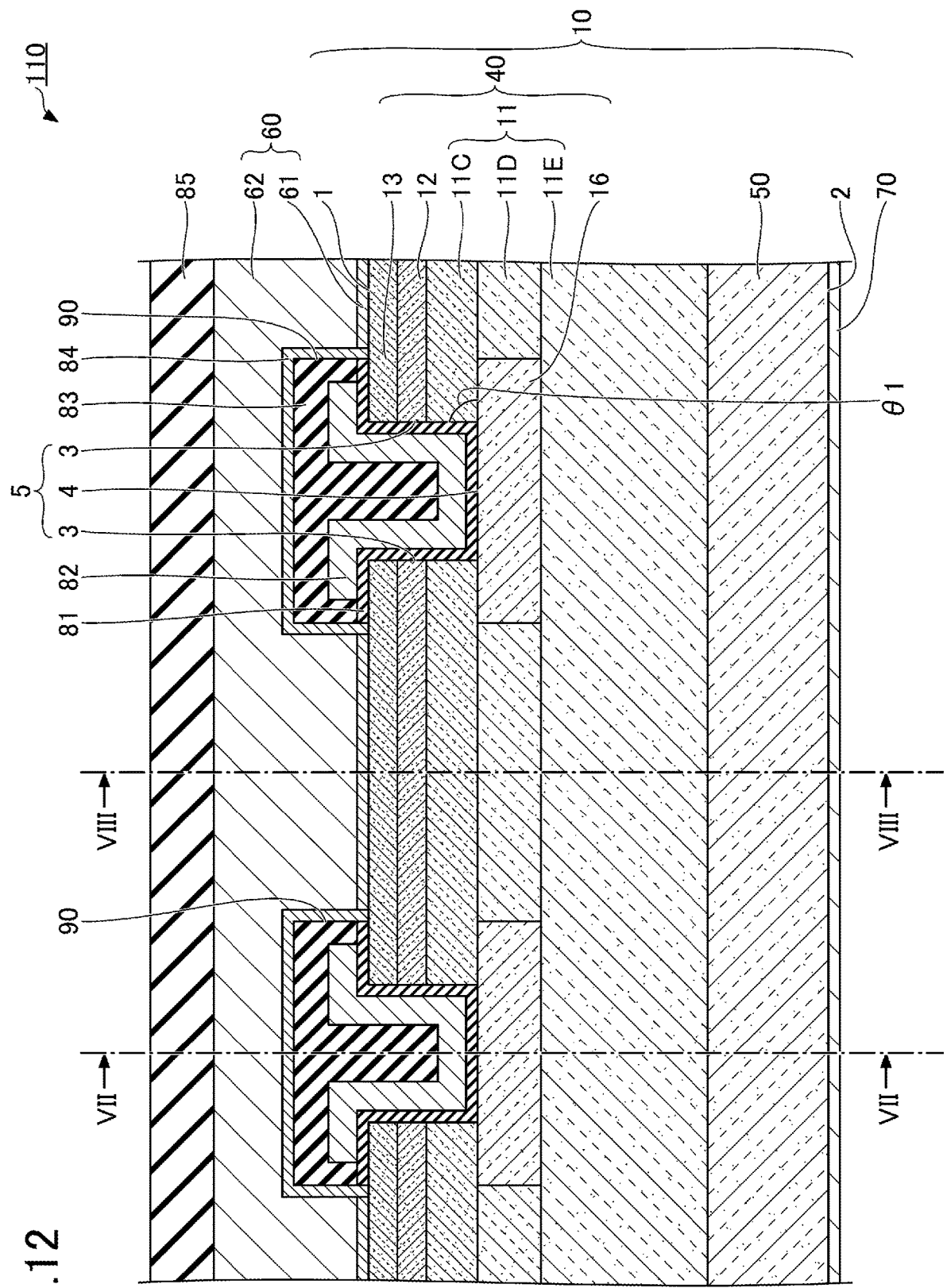
FIG. 12 is a cross-sectional view illustrating a structure of a silicon carbide semiconductor device according to a first modified example of the embodiment.

Next, a first modified example of the embodiment will be described. The first modified example differs from the embodiment primarily in the shape of the gate trench. FIG. 12 is a cross-sectional view illustrating a configuration of a MOSFET (silicon carbide semiconductor device) according to the first modified example of the embodiment. FIG. 12 illustrates a cross-section, as with the cross-section along the IV-IV line in FIG. 3.

As illustrated in FIG. 12, in a MOSFET 110 of the first modified example, the gate trench 5 is a vertical trench. That is, the angle θ1 of the side surface 3 relative to the plane including the bottom surface 4 may be 90°. Other structures are substantially the same as those in the embodiment.

According to such a first modified example, substantially the same effect as that of the embodiment can be obtained.

Second Modified Example

Figure 13:
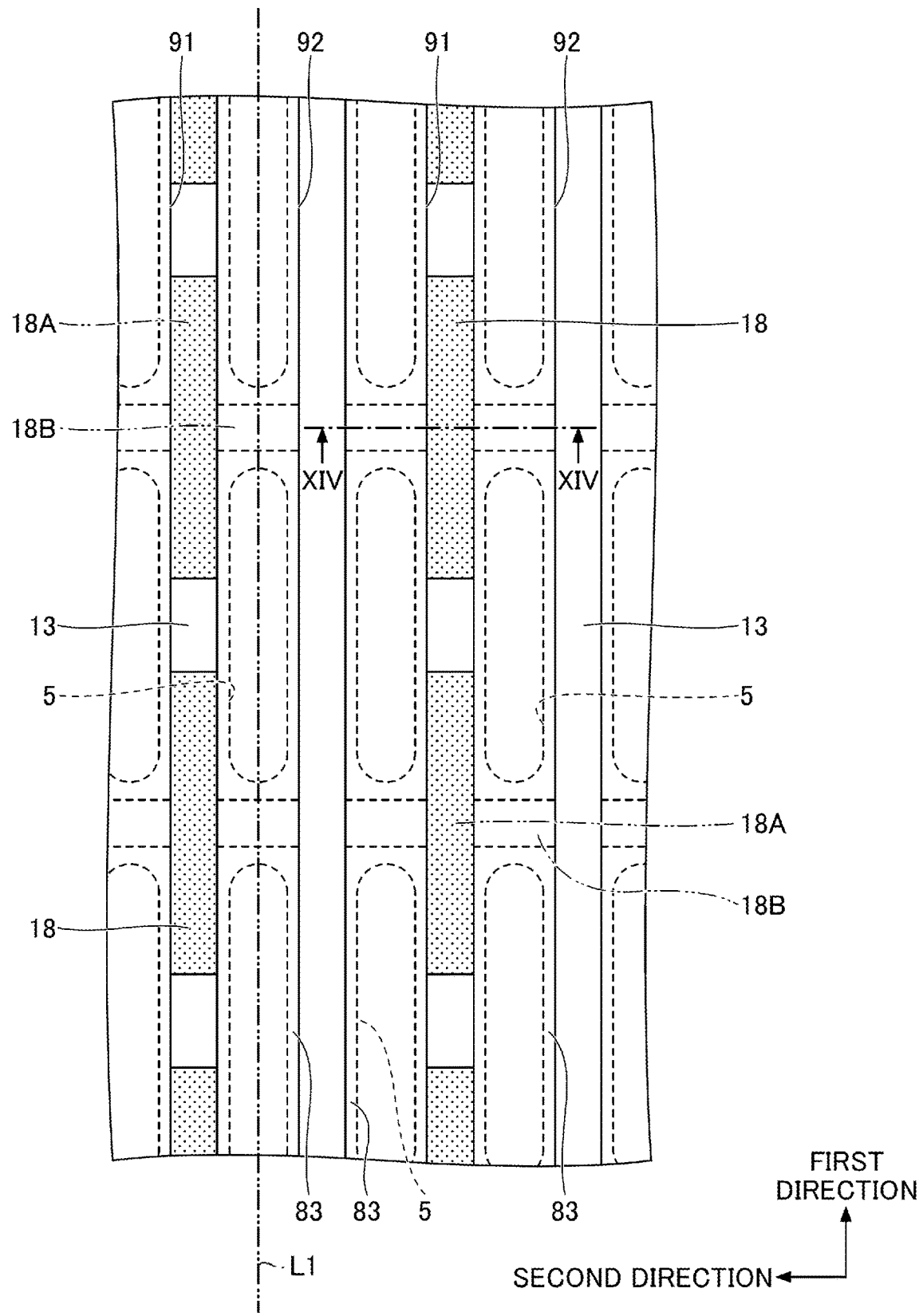
FIG. 13 is a diagram illustrating a structure of an interlayer insulating film and a first main surface of a silicon carbide semiconductor device according to a second modified example of the embodiment.
Figure 14:
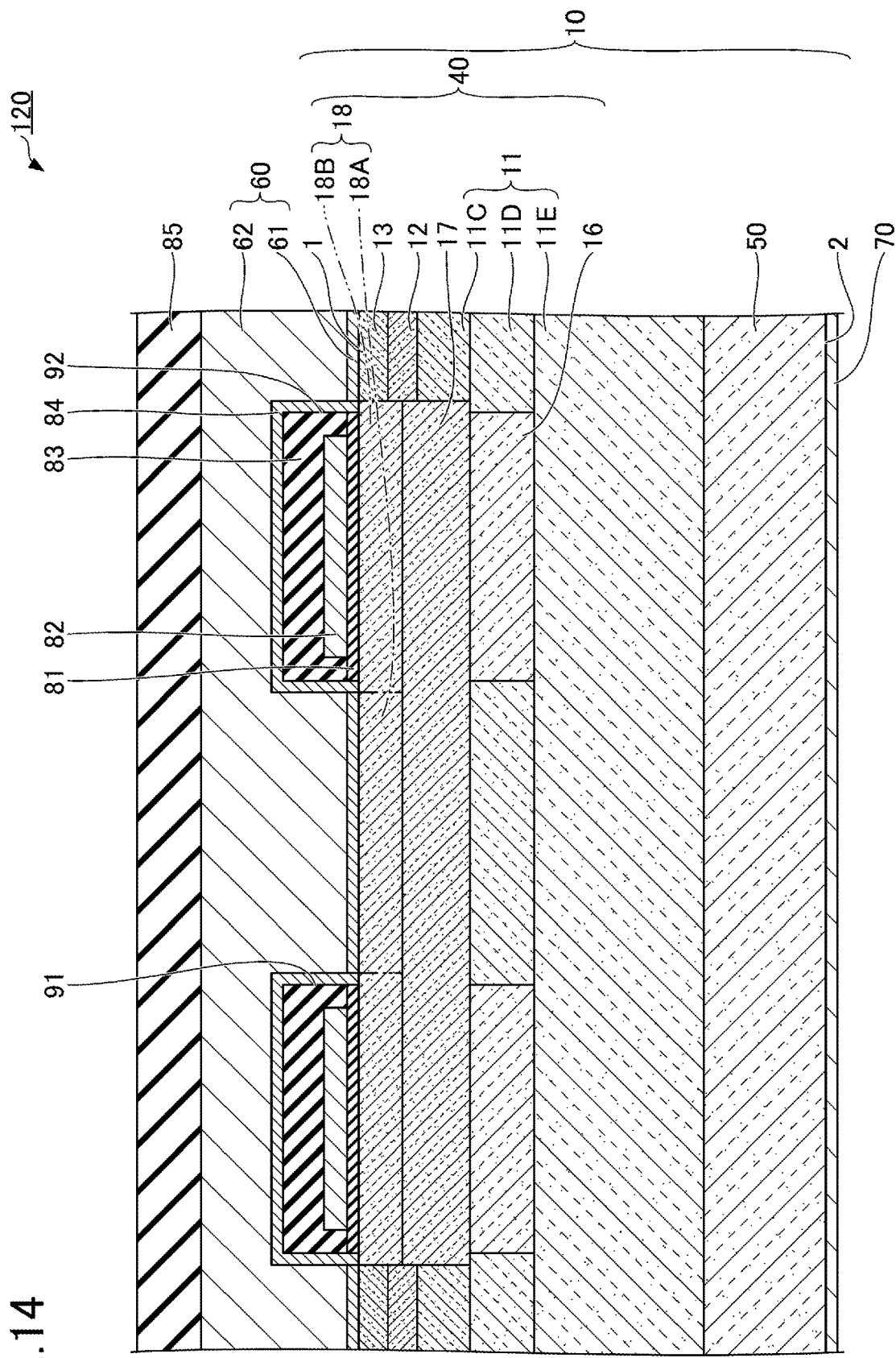
FIG. 14 is a cross-sectional view illustrating a structure of the silicon carbide semiconductor device according to the second modified example of the embodiment.

Next, a second modified example of the embodiment will be described. The second modified example differs from the embodiment primarily in the position of the first region 18A. FIG. 13 is a diagram illustrating a structure of an interlayer insulating film and a first main surface of a silicon carbide semiconductor device according to the second modified example of the embodiment. FIG. 14 is a cross-sectional view illustrating a structure of the silicon carbide semiconductor device according to the second modified example of the embodiment. FIG. 14 corresponds to the cross-sectional view along the XIV-XIV line in FIG. 13.

In a MOSFET 120 according to the second modified example, as illustrated in FIG. 13 and FIG. 14, the first region 18A is provided on only one side of the gate trench 5 in the second direction. A contact hole 91 and a contact hole 92 are formed in the interlayer insulating film 83. The contact hole 91 and the contact hole 92 are alternately arranged in the second direction. The first region 18A may be provided in an exposed portion of the first main surface 1 at the contact hole 91, but is not necessarily provided in an exposed portion of the first main surface 1 at the contact hole 92. The first region 18A and the source region 13 may be exposed from the contact hole 91. Only the source region 13 may be exposed from the contact hole 92. Inside the contact hole 91, the contact electrode 61 forms an ohmic junction with each of the source region 13 and the first region 18A. Inside the contact hole 92, the contact electrode 61 forms an ohmic junction with the source region 13. Other structures are substantially the same as those in the embodiment.

The second modified example can also reduce the feedback capacity, and can reduce switching loss and improve the switching speed by reducing the feedback capacity. The second modified example can also ensure sufficient drain current. The second modified example can also prevent the electrical breakdown of the gate insulating film 81 due to the electric field concentration near the upper end of the gate trench 5. The second modified example can also reduce the series resistance between the second region 18B and the electric field relaxation region 16.

Third Modified Example

Figure 15:
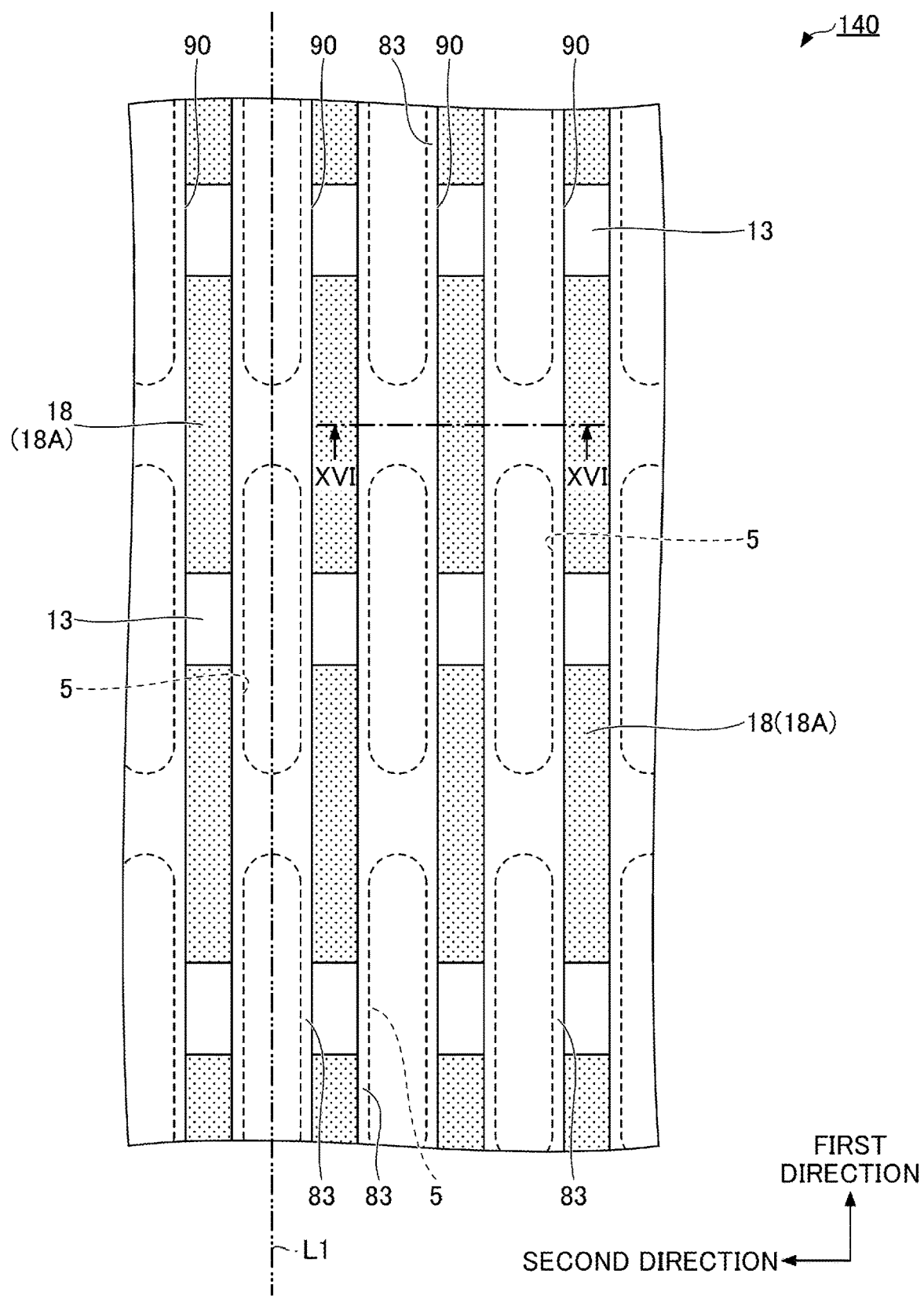
FIG. 15 is a diagram illustrating a structure of an interlayer insulating film and a first main surface of a silicon carbide semiconductor device according to a third modified example of the embodiment.
Figure 16:
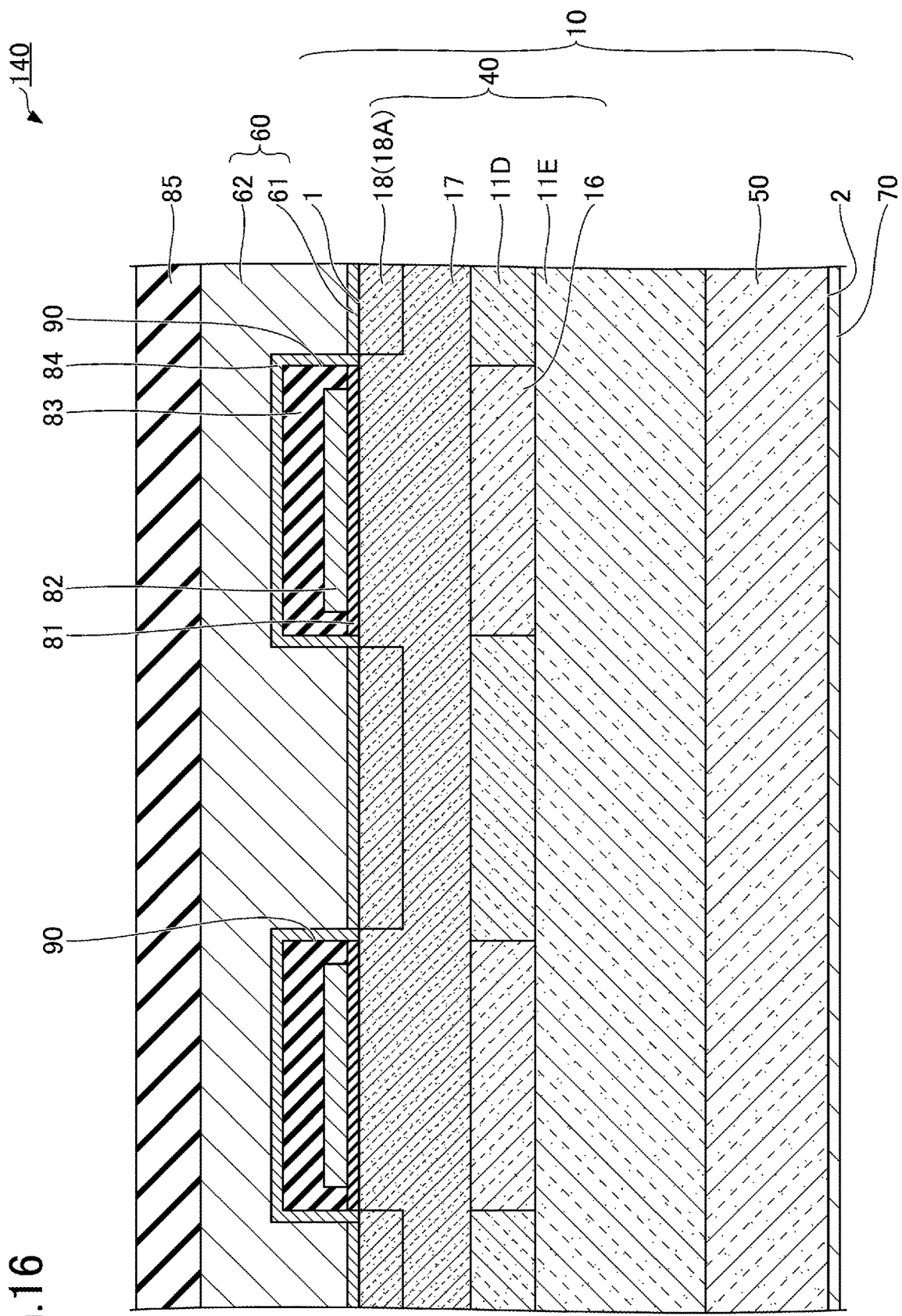
FIG. 16 is a cross-sectional view illustrating a structure of the silicon carbide semiconductor device according to the third modified example of the embodiment.

Next, a third modified example of the embodiment will be described. The third modified example differs from the embodiment primarily in the structure of the contact region 18. FIG. 15 is a diagram illustrating a structure of an interlayer insulating film and a first main surface of a silicon carbide semiconductor device according to the third modified example of the embodiment. FIG. 16 is a cross-sectional view illustrating a structure of the silicon carbide semiconductor device according to the third modified example of the embodiment. FIG. 16 corresponds to the cross-sectional view along the XVI-XVI line in FIG. 15.

In a MOSFET 140 according to the third modified example, as illustrated in FIG. 15 and FIG. 16, the first region 18A forms the contact region 18 and the second region 18B is not included in the contact region 18. Below the interlayer insulating film 83 and the barrier metal film 84 between the gate trenches 5 adjacent in the first direction, the connection region 17 may form the first main surface 1. The connection region 17 may be in contact with the gate insulating film 81 and the barrier metal film 84. Other structures are substantially the same as those in the embodiment.

The third modified example can also reduce the feedback capacity, and can reduce switching loss and improve the switching speed by reducing the feedback capacity. The third modified example can also ensure sufficient drain current. The third modified example can also prevent the electrical breakdown of the gate insulating film 81 due to the electric field concentration near the upper end of the gate trench 5. The third modified example can also reduce the electric resistance between the source electrode 60 and the electric field relaxation region 16 in comparison with the case in which the first region 18A is provided on only one side of the gate trench 5 in the second direction.

Fourth Modified Example

Figure 17:
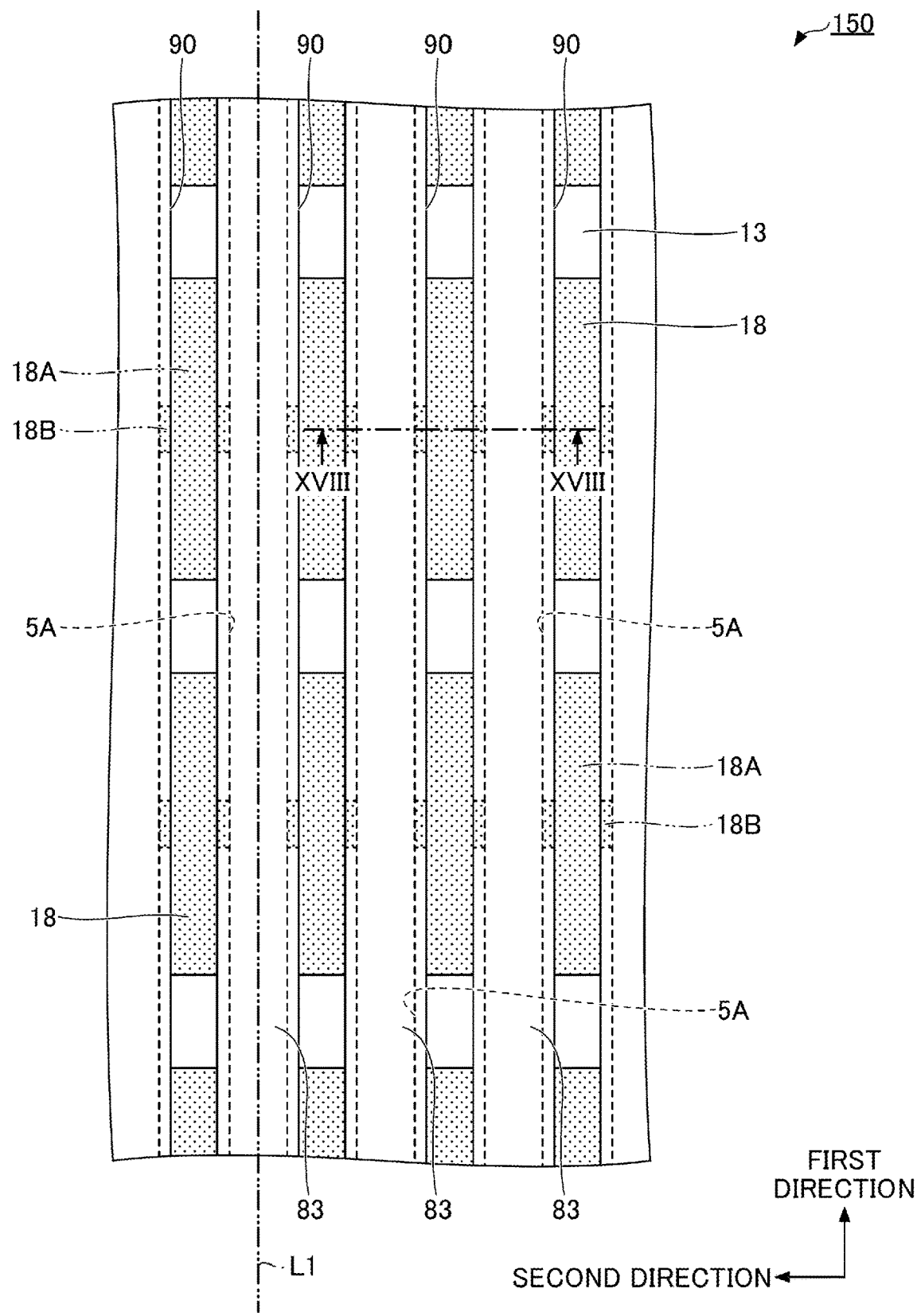
FIG. 17 is a diagram illustrating a structure of an interlayer insulating film and a first main surface of a silicon carbide semiconductor device according to a fourth modified example of the embodiment.
Figure 18:
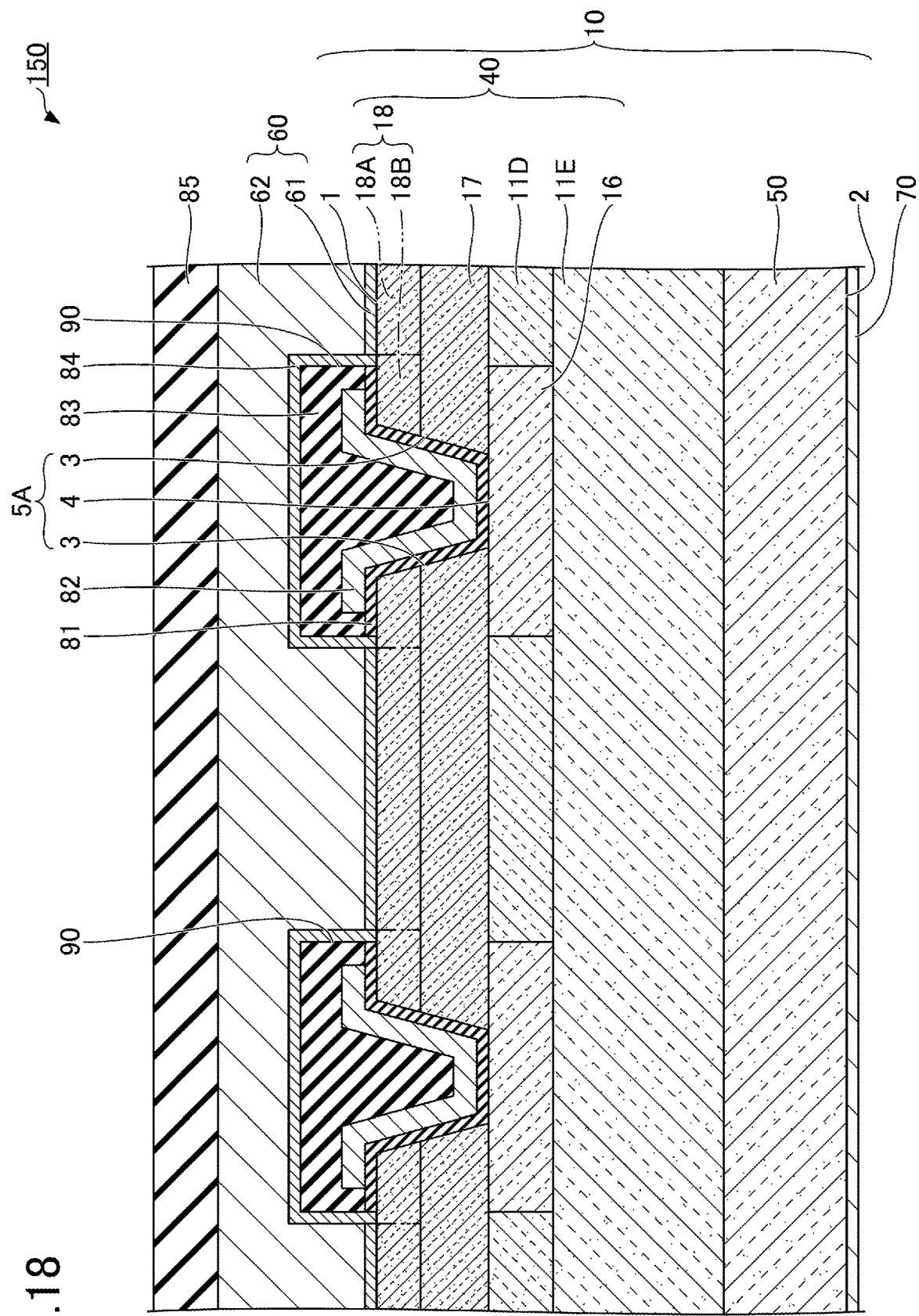
FIG. 18 is a cross-sectional view illustrating the structure of the silicon carbide semiconductor device according to the fourth modified example of the embodiment.

Next, a fourth modified example of the embodiment will be described. The fourth modified example differs from the embodiment primarily in the structure of the gate trench 5. FIG. 17 is a diagram illustrating a structure of an interlayer insulating film and a first main surface of a silicon carbide semiconductor device according to the fourth modified example of the embodiment. FIG. 18 is a cross-sectional view illustrating a structure of the silicon carbide semiconductor device according to the fourth modified example of the embodiment. FIG. 18 corresponds to the cross-sectional view along the XVIII-XVIII line in FIG. 17.

In a MOSFET 150 according to the fourth modified example, as illustrated in FIG. 17 and FIG. 18, multiple gate trenches 5 arranged on the virtual line L1 in the embodiment are connected to each other to form the gate trench 5A. The second region 18B and the connection region 17 are provided on each side of the gate trench 5A in the second direction. The second region 18B and the connection region 17 may be in contact with the side surface 3. Other structures are substantially the same as those in the embodiment.

The fourth modified example also reduces the feedback capacity, and can reduce switching loss and improve the switching speed by reducing the feedback capacity. The fourth modified example can also ensure sufficient drain current. The fourth modified example can also reduce the electrical resistance between the source electrode 60 and the electric field relaxation region 16 in comparison with the case in which the first region 18A is provided on only one side of the gate trench 5 in the second direction. The fourth modified example can also reduce the series resistance between the second region 18B and the electric field relaxation region 16.

In the description of the above-described embodiment and reference examples, the n-type is referred to as the first conductivity type and the p-type is referred to as the second conductivity type. However, the p-type may be referred to as the first conductivity type and the n-type may be referred to as the second conductivity type. The above-described embodiment and reference examples have been described with reference to the MOSFET as an example of the silicon carbide semiconductor devices. However, the silicon carbide semiconductor device may be, for example, an insulated gate bipolar transistor (IGBT). The effective concentration of the p-type impurity and the effective concentration of the n-type impurity in the above-described respective impurity regions can be measured by, for example, scanning capacitance microscope (SCM) or secondary ion mass spectrometry (SIMS). The location of the interface between the p-type region and the n-type region (i.e., the pn junction interface) can be determined by, for example, SCM or SIMS. The distribution of the effective concentration of the majority carrier in the current spreading region can be determined based on the distribution of the thickness of the depletion layer generated by, for example, the pn junction between the current spreading region and the body region, without measuring the effective concentration. The thickness of the depletion layer can be identified by, for example, SCM or SIMS.

The embodiment has been described in detail above, but is not limited to the particular embodiment. Various variations and modifications can be made within the scope of the claims.

DESCRIPTION OF THE REFERENCE NUMERALS 1 first main surface
2 second main surface
3 side surface
4 bottom surface
5, 5A gate trench
10 silicon carbide substrate
11 drift region
11C third region
11D fourth region
11E fifth region
12 body region
13 source region
16 electric field relaxation region
17 connection region
18 contact region
18A first region
18B second region
21 first epitaxial layer
22 second epitaxial layer
40 silicon carbide epitaxial layer
50 silicon carbide single crystal substrate
60 source electrode
61 contact electrode
62 source wiring
70 drain wiring
81 gate insulating film
82 gate electrode
83 interlayer insulating film
84 barrier metal film.
85 passivation film
90, 91, 92 contact hole
100, 110, 120, 140, 150 silicon carbide semiconductor device (MOSFET)
Wp1 first dimension
Wp2 second dimension
Wn third dimension
Wch sum
θ1 angle

The invention claimed is:

1. A silicon carbide semiconductor device comprising a silicon carbide substrate having a first main surface and a second main surface opposite to the first main surface, the silicon carbide substrate including:
   a drift region that is a first conductive type;
   a body region that is a second conductive type different from the first conductive type, the body region being provided on the drift region;
   a source region that is the first conductive type, the source region being provided on the body region to be separated from the drift region, and
   a contact region that is the second conductive type, the contact region being provided on the body region,
   wherein a gate trench is provided in the first main surface, the gate trench being defined by side surfaces and a bottom surface, the side surfaces penetrating the source region and the body region to reach the drift region, the bottom surface connecting to the side surfaces, and the gate trench extending in a first direction parallel to the first main surface,
   the silicon carbide semiconductor device further comprising a source electrode connected to the source region and the contact region, the silicon carbide substrate further including:
      an electric field relaxation region that is the second conductive type, the electric field relaxation region being provided between the bottom surface and the second main surface and extending in the first direction; and
      a connection region that is the second conductive type, the connection region electrically connecting the contact region to the electric field relaxation region,
   wherein, in a plan view in a direction normal to the first main surface, the gate trench and the electric field relaxation region are disposed on a virtual line that extends in the first direction, and the connection region is in contact with the electric field relaxation region on the virtual line.

2. The silicon carbide semiconductor device as claimed in claim 1,
   wherein a plurality of said gate trenches are provided to overlap the virtual line at constant intervals, and
   wherein the connection region is provided between adjacent gate trenches among the plurality of gate trenches, the adjacent gate trenches being adjacent in the first direction in the plan view.

3. The silicon carbide semiconductor device as claimed in claim 2, further comprising:
   a gate insulating film that is in contact with the side surfaces and the bottom surface;
   a gate electrode provided on the gate insulating film to sandwich the gate insulating film between the gate electrode and the silicon carbide substrate; and
   an interlayer insulating film provided to cover the gate electrode,
   wherein, in the plan view in the direction perpendicular to the first direction, the contact region has a first region and a second region, the first region being provided to be spaced away from the interlayer insulating film in a second direction perpendicular to the first direction, and the second region being provided between the adjacent gate trenches, wherein the source electrode is connected to the first region, and wherein a first dimension of the first region in the first direction is greater than a second dimension of the second region in the first direction.

4. The silicon carbide semiconductor device as claimed in claim 3, wherein the first dimension is one or greater and six or less times the second dimension.

5. The silicon carbide semiconductor device as claimed in claim 3, wherein the source region and the first region are alternately provided in the first direction, and wherein the first dimension is greater than a third dimension of the source region in the first direction.

6. The silicon carbide semiconductor device as claimed in claim 3, wherein the source region and the first region are alternately provided in the first direction, and wherein the first dimension is 0.2 or greater and 0.6 or less times a sum of the first dimension and a third dimension of the source region in the first direction.

7. The silicon carbide semiconductor device as claimed in claim 3, wherein the second region is exposed from the interlayer insulating film, and wherein the source electrode is also connected to the second region.

8. The silicon carbide semiconductor device as claimed in claim 3, wherein the first region of the contact region is provided on each side of the gate trench in the second direction.

9. The silicon carbide semiconductor device as claimed in claim 3, wherein the first region of the contact region is provided on only one side of the gate trench in the second direction.

10. The silicon carbide semiconductor device as claimed in claim 1, wherein a first effective concentration of a second conductive type impurity in the contact region is higher than a second effective concentration of a second conductive type impurity in the connection region.

11. The silicon carbide semiconductor device as claimed in claim 1, wherein the side surfaces of the gate trench include a {0-33-8} plane.

* * * * *